(12) United States Patent
Aratani et al.

(10) Patent No.: US 7,009,208 B2
(45) Date of Patent: Mar. 7, 2006

(54) MEMORY DEVICE AND METHOD OF PRODUCTION AND METHOD OF USE OF SAME AND SEMICONDUCTOR DEVICE AND METHOD OF PRODUCTION OF SAME

(75) Inventors: Katsuhisa Aratani, Chiba (JP); Minoru Ishida, Tokyo (JP); Akira Kouchiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/410,789

(22) Filed: Apr. 10, 2003

(65) Prior Publication Data

US 2003/0234449 A1 Dec. 25, 2003

(30) Foreign Application Priority Data

Apr. 18, 2002 (JP) .............................. 2002-116562
Aug. 22, 2002 (JP) .............................. 2002-242653

(51) Int. Cl.
*H01L 29/04* (2006.01)
(52) U.S. Cl. ............................ 257/74; 257/49; 257/52; 257/63
(58) Field of Classification Search ................. 257/49, 257/52, 63, 74
See application file for complete search history.

(56) References Cited

U.S. PATENT DOCUMENTS

| 5,691,572 | A |   | 11/1997 | Chung |   |
|---|---|---|---|---|---|
| 5,745,407 | A | * | 4/1998 | Levy et al. | ................. 365/159 |
| 6,034,882 | A |   | 3/2000 | Johnson et al. |   |
| 6,078,106 | A | * | 6/2000 | Kawata | ..................... 257/758 |
| 2002/0024085 | A1 |   | 2/2002 | Shunji et al. |   |
| 2002/0185736 | A1 |   | 12/2002 | Hiroyuki |   |

FOREIGN PATENT DOCUMENTS

| JP | 09-116028 | 5/1997 |
|---|---|---|
| JP | 11-340326 | 12/1999 |

* cited by examiner

*Primary Examiner*—Long Pham
*Assistant Examiner*—Wai-Sing Louie
(74) *Attorney, Agent, or Firm*—Robert J. Depke; Trexler, Bushnell, Giangiorgi, Blackstone & Marr, Ltd.

(57) ABSTRACT

A memory device able to be produced without requiring high precision alignment, a method of production of the same, and a method of use of a memory device produced in this way, wherein a peripheral circuit portion (first semiconductor portion) formed by a first minimum processing dimension is formed on a substrate, a memory portion (second semiconductor portion) formed by a second minimum processing dimension smaller than the first minimum processing dimension is stacked above it, and the memory portion (second semiconductor portion) is stacked with respect to the peripheral circuit portion (first semiconductor portion) with an alignment precision rougher than the second minimum processing dimension or wherein memory cells configured by 2-terminal devices are formed in regions where word lines and bit lines intersect in the memory portion, and contact portions connecting the word lines and bit lines and the peripheral circuit portions are arranged in at least two columns in directions in which the word lines and the bit lines extend.

5 Claims, 23 Drawing Sheets

MEMORY DEVICE AND METHOD OF PRODUCTION AND METHOD OF USE OF SAME AND SEMICONDUCTOR DEVICE AND METHOD OF PRODUCTION OF SAME

BACKGROUND OF THE INVENTION

1. Field of the Invention

The present invention relates to a memory device and a method of production and method of use of the same and to a semiconductor device and a method of production of the same, more particularly relates to a memory device able to be formed by stacking fine patterns of memory cells etc. with a low alignment precision and a method of production and method of use of the same and to a semiconductor device able to be formed by stacking fine patterns etc. with a low alignment precision, and a method of production of the same.

2. Description of the Related Art

As memory devices, mask read only memories (ROMs), programmable read only memories (PROMs), static random access memories (SRAMs), dynamic random accessor memories (DRAM), flash memories, ferroelectric random access memories (FeRAMs), magnetic random access memories (MRAM), phase change memories, and numerous other solid state memory devices have been developed and produced.

Almost all of the above types of solid state memory devices are prepared using the microprocessing technology referred to as "photolithography" and have memory cell structures using metal-oxide-semiconductor field effect transistors (MOS field effect transistors, hereinafter, also simply referred to as "MOS transistors").

In all of the above types of memories of the above types of memory devices, microprocessing technology for further reducing the minimum processing line width in photolithography for achieving higher recording densities and lower prices is being developed. Along with this, MOS transistors designed for such microprocessing technology and further memory cell structures, cell recording materials, etc. compatible with them are being developed.

For the microprocessing, processes involving a minimum processing line width F (design rule or node) of 0.13 $\mu$m are currently being used for mass production in the cutting edge of the art. The road map is being laid out for this to be reduced to 0.10 $\mu$m in the next generation and further 0.07 $\mu$m, 0.05 $\mu$m, and 0.035 $\mu$m in later generations.

If the minimum processing line width is reduced in this way, the size of the memory cells will be reduced according, so the recording density will be improved and memories will be made larger in capacity.

In the currently used photolithography, a light source of the wavelength range referred to as "deep ultraviolet", that is, a KrF laser having a wavelength of 248 nm, is being used as an exposure light source. Further, in cutting edge processes, an ArF laser having a wavelength of 193 nm is being used. Microprocessing up to 0.10 $\mu$m is possible by these.

Further, for future generations, photolithography using extreme ultraviolet rays having a wavelength of 13 nm (EUV) and electron projection lithography (EPL) are considered promising.

However, the types of photolithography using the above light sources are all more expensive than conventional types of photolithography in the light sources, electron beam sources, lens systems, masks, etc. Further, ultra-high precision is required in the mechanical systems since it is necessary to further improve the overlay precision of the masks, that is, the alignment precision. Therefore, even if the microprocessing line width becomes smaller and the recording density of a memory is improved, there is a large problem in the point of the increase in the cost due to the capital costs or the reduction in the throughput.

The alignment precision is for example about 30% of the minimum processing line width. If the minimum processing line width is 0.05 $\mu$m, a precision of 0.015 $\mu$m will be necessary.

As a technology enabling microprocessing at a lower cost than the above EUV and EPL, low energy electron projection lithography (LEEPL) has been known.

"LEEPL" is a method using a thin mask having openings of equal magnification and the same shapes as the processed shapes and passing low energy electrons through the openings to strike and thereby expose a resist covering the surface of the processed material.

On the other hand, as an inexpensive microprocessing technology different from the above photolithography, for example, Y. Xia and G. M. Whitesides, "Soft Lithography", *Angew. Chem. Int. Ed.*, 37 (1998), pp. 550–575 discloses the technology referred to as "soft lithography".

In soft lithography, microprocessing is performed by bringing an elastic body formed in advance on its surface with fine relief patterns into contact with for example a resist on the surface of the substrate to be micropatterned to transfer the relief pattern of the elastic body to the resist on the substrate and forming them on the substrate by subsequent etching or other processes.

The above elastic body is formed by a plastic, a thin inorganic material, or the like. Since a soft material is used, the above lithography technology is referred to as "soft lithography".

Also, W. Hinsberg, F. A. Houle, J. Hoffnagle, M. Sanchez, G. Wallraff, M. Morrison, and S. Frank, "Deep-ultraviolet interferometric lithography as a tool for assessment of chemically amplified photoresist performance", *J. Vac. Sci. Technol. B*, 16, pg. 3689 (1998) discloses the inexpensive lithography method referred to as "interference exposure".

In interference exposure, a phase-aligned laser beam is split into two in space by a beam splitter, the two split beams are made to strike the resist on the surface of the substrate for patterning from different directions, and the two beams are made to interfere with each other on the resist surface so as to form a line pattern having a fine period on the resist surface.

Further, it is known that the microprocessing line width can be easily reduced not only by photolithography by the conventional reduction projection exposure systems referred to as "steppers" or "scanners", but also by so-called contact exposure bringing a mask into direct contact with the resist on the surface of the substrate to be patterned.

In this case, ultraviolet (UV) light or an electron beam is used as the source.

Further, as technologies contributing to improvement of the recording density and lower costs other than the above microprocessing technologies, multi-value storage or multi-bit storage in a single memory cell is being developed.

For example, in a flash memory, data is recorded by storing a charge in a floating gate directly above a gate oxide film of a MOS transistor. Here, for improving the recording density, technology is known for improving the recording density by so-called multi-value storage storing 2 bits of data in a single cell by for example not setting the stored charge to the conventional two levels, but setting it to for example four levels.

Further, in a memory referred to as a "MONOS", data is recorded by arranging a silicon nitride film directly above the gate oxide film of a MOS transistor and storing a charge at its defect level. Here, technology is known for improving the effective recording density by so-called multi-bit storage storing a bit for storing a charge in the portion of the nitride film in proximity to the source portion of the MOS transistor and a bit for storing it in the portion of the nitride film in proximity to the drain portion.

In the above flash memory or MONOS or other charge storage type memory, it is possible to improve the recording density by the technique of multi-value or multi-bit storage in addition to microprocessing, but it is known that the charge stored in a portion isolated by an insulating film falls due to leakage along with the elapse of time, so there is a problem in the reliability of data retention.

In the future, the stored charge will decrease along with advances in microprocessing, so this will be a difficult to avoid problem.

Furthermore, as technology contributing to the improvement of the recording density and the lower costs, stacking of multiple cell layers is being developed.

In a flash memory or MONOS or other charge storage type memory, the change in the gate threshold voltage of a MOS transistor in accordance with the storage of a charge is used for reproduction, so a MOS transistor is required for the memory cell. A MOS transistor requires a silicon single crystal for forming a channel portion and a high grade thin insulating film at the gate portion, so is formed on a silicon substrate surface. Therefore, it is difficult to stack MOS transistors having similar performances.

Accordingly, in a memory using MOS transistors for the cells, fabrication of a so-called multi-layer memory or three-dimensional memory stacking memory cells is difficult.

On the other hand, as a multi-layer memory or three-dimensional memory, for example, a PROM using memory cells configured by providing anti-fuse recording materials and diodes serially connected with the same such as pn diodes, metal-insulator-metal (MIM) diodes, and Schottky diodes at intersecting positions of two interconnect patterns extending in two directions is disclosed in U.S. Pat. No. 6,034,882.

In the above PROM, interconnects and cells are alternately stacked on the substrate in a direction vertical to the substrate to construct a multi-layer memory or three-dimensional memory. In this case, since MOS transistors are used for the cells, it is possible to stack the cells relatively easily, but keeping down the threshold voltage of the diodes and further keeping down variations in the same to achieve uniform characteristics becomes a problem.

For example, in a silicon pn junction diode, the threshold voltage is about 0.6V, so with each succeeding generation of microprocessing in the future, there will be the problem of the threshold voltage of the diodes becomes the same degree as or higher than the operating voltage of the MOS transistors used in peripheral circuits or the device power supply voltage.

Further, for a MIM diode, the phenomenon of electrons tunneling through the insulating film, that is, the so-called "tunnel effect", is used, so the film thickness required for low voltage driving becomes an extremely thin one of several nm. It is necessary to control the thickness with a very high precision. This becomes a problem in practice.

Further, a Schottky diode uses the interface phenomenon between a metal and the surface of a semiconductor. It is necessary to control the state of the interface to an extremely high quality. Therefore, this is not suitable for a stacked structure like that of a multi-layer memory.

Further, in the above pn junction diode or Schottky diode, the diode is formed by forming a depletion layer between different types of materials, but a distance of about 100 nm is required for a pn junction diode and a distance of tens of nm or more is required in a Schottky diode for the formation of the depletion layer.

When the size of the microprocessing becomes 100 nm or less, if the thickness of only the diode becomes tens of nm or more, since the recording material is further connected to this in series, the aspect ratio of processing becomes 1 or more or 2 or more, so the problem of a drop in the yield of the microprocessing is also feared.

A PROM using a fuse or anti-fuse or the like as a recording material has a simpler structure in comparison with a RAM capable of repeated recording and can be fabricated by a simple process, so is a recording device perfect for reduction of the bit unit cost, but can only record once, so imposes a large constraint on the specifications and applications.

Summarizing the problems to be solved by the invention, the microprocessing technology required for lowering the cost per bit of a memory device is high in capital cost in both the case of EUV and EPL. In other microprocessing methods including the microprocessing technology LEEPL, there is the problem that it is difficult to secure the alignment precision required in accordance with the minimum processing line width.

Further, the above soft lithography, interference exposure, contact exposure, and other methods known as inexpensive microprocessing technology are suitable for processing fine line widths, but are not capable of precision alignment.

SUMMARY OF THE INVENTION

A first object of the present invention is to provide a memory device able to be produced without requiring high precision alignment, a method of production of the same, and a method of use of a memory device produced in this way.

A second object of the present invention is to provide a semiconductor device able to be produced without requiring high precision alignment and a method of production of the same.

To attain the first object, according to a first aspect of the present invention, there is provided a memory device having a peripheral circuit portion formed by a first minimum processing dimension, a memory portion stacked above the peripheral circuit portion and having a plurality of memory cells formed by a second minimum processing dimension smaller than the first minimum processing dimension, and contact portions connecting the peripheral circuit portion and the memory portion, wherein the memory portion is stacked with respect to the peripheral circuit portion by an alignment precision rougher than the second minimum processing dimension.

That is, the memory device of the first aspect of the present invention has a stacked structure of a peripheral circuit portion formed by the first minimum processing dimension and a memory portion formed by a second minimum processing dimension smaller than the first minimum processing dimension. The memory portion is stacked with respect to the peripheral circuit portion with an alignment precision rougher than the second minimum processing dimension.

Preferably, the memory portion has a plurality of first interconnects extending in a first direction and has a plurality of second interconnects extending in a direction different from the first direction, and regions where the first interconnects and the second interconnects intersect correspond to individual memory cells.

More preferably, in the regions where the first interconnect and the second interconnects intersect, 2-terminal devices are formed connected to the first interconnects and the second interconnects, each of the 2-terminal devices corresponding to individual memory cells.

Preferably, the peripheral circuit portion includes a circuit for judging a state of connection of the memory portion and the interconnects.

More preferably, in the contact portions, a plurality of first contacts connected to the peripheral circuit portion and a plurality of second contacts connected to the memory portion are connected, the number of the first contacts is larger than the number of the second contacts, each second contact is connected to at least one first contact, each first contact is connected to at most one second contact, and one second contact is connected to any one interconnect among the plurality of the first interconnects and the plurality of the second interconnects.

To attain the first object, according to a second aspect of the present invention, there is provided a method of production of a memory device comprising a step of forming a peripheral circuit portion on a semiconductor substrate by a first minimum processing dimension; a step of forming a plurality of first contacts connected to the peripheral circuit portion; a step of forming a memory portion stacked above the peripheral circuit portion by a second minimum processing dimension smaller than the first minimum processing dimension and with an alignment precision rougher than the second minimum processing dimension with respect to the peripheral circuit portion; and a step of forming connected to the first contacts a plurality of second contacts connected to the memory portion.

That is, in the above method of production of a memory device of this aspect of the present invention, the peripheral circuit portion is formed on the semiconductor substrate by the first minimum processing dimension, then a plurality of first contacts connected to the peripheral circuit portion are formed. Next, the memory portion is stacked above the peripheral circuit portion by the second minimum processing dimension smaller than the first minimum processing dimension and with an alignment precision rougher than the second minimum processing dimension with respect to the peripheral circuit portion, then a plurality of second contacts connected to the memory portion are formed connected to the first contacts.

Preferably, the step of forming the memory portion has a step of forming a plurality of first interconnects extending in a first direction, a step of forming devices forming memory cells so as to be connected to the first interconnects in at least regions corresponding to individual memory cells, and a step of forming a plurality of second interconnects extending in a direction different from the first direction so as to be connected to the devices, and, in the step of forming the first interconnects, they are formed connecting the first interconnects and one second contact. In the step of forming the second interconnects, they are formed connecting the second interconnects and one second contact.

Alternatively, the step of forming the peripheral circuit portion includes a step of forming a circuit for judging the state of connection between the memory portion and the interconnects.

Alternatively, the first contacts are formed in a number larger than the number of the second contacts, each second contact is connected to at least one first contact, and each first contact is connected to at most one second contact.

To attain the first object, according to a third aspect of the present invention, there is provided a method of use of a memory device having a peripheral circuit portion formed by a first minimum processing dimension, a memory portion having a plurality of memory cells formed by a second minimum processing dimension smaller than the first minimum processing dimension, and contact portions connecting the peripheral circuit portion and the memory portion, the memory portion being stacked with respect to the peripheral circuit portion with an alignment precision rougher than the second minimum processing dimension, a plurality of first contacts connected to the peripheral circuit portion and a plurality of second contacts connected to the memory portion being connected in the contact portions, the number of the first contacts being larger than the number of the second contacts, each second contact being connected to at least one first contact, and each first contact being connected to at most one second contact, which method of use judges a state of connection of the first contacts and the second contacts at a time of ending production of the memory device or a time of using the memory device and assigns addresses to memory cells constituting the memory portion.

That is, the method of use of a memory device of this aspect of the present invention is for use of a memory device wherein a plurality of first contacts connected to the peripheral circuit portion and a plurality of second contacts connected to the memory portion are connected, the number of the first contacts is larger than the number of the second contacts, each second contact is connected to at least one first contact, and each first contact is connected to at most one second contact and comprises judging the state of connection of the first contacts and the second contacts and assigning addresses to the memory cells constituting the memory portion at the time of the ending production of the memory device or the time of using the memory device.

To attain the second object, according to a fourth aspect of the present invention, there is provided a semiconductor device having a first semiconductor portion formed by a first minimum processing dimension, a second semiconductor portion stacked above the first semiconductor portion and formed by a second minimum processing dimension smaller than the first minimum processing dimension, and contact portions connecting the first semiconductor portion and the second semiconductor portion, wherein the second semiconductor portion is stacked with respect to the first semiconductor portion by an alignment precision rougher than the second minimum processing dimension.

That is, the semiconductor device of this aspect of the present invention has a structure wherein the first semiconductor portion formed by the first minimum processing dimension and the second semiconductor portion formed by the second minimum processing dimension smaller than the first minimum processing dimension are stacked, and the second semiconductor portion is stacked with respect to the first semiconductor portion by an alignment precision rougher than the second minimum processing dimension.

To attain the second object, according to a fifth aspect of the present invention, there is provided a method of production of a semiconductor device comprising a step of forming a first semiconductor portion on a semiconductor substrate by a first minimum processing dimension; a step of forming a plurality of first contacts connected to the first semiconductor portion; a step of forming a second semiconductor portion stacked above the first semiconductor portion by a second minimum processing dimension smaller than the first minimum processing dimension and with an alignment precision rougher than the second minimum processing dimension with respect to the first semiconductor portion; and a step of forming a plurality of second contacts connected to the second semiconductor portion by connection to the first contacts.

That is, the method of production of the semiconductor device of this aspect of the present invention forms the first semiconductor portion on the semiconductor substrate by the first minimum processing dimension and then forms a plurality of first contacts connected to the first semiconductor portion. Next, it forms the second semiconductor portion above the first semiconductor portion by stacking by the second minimum processing dimension smaller than the first minimum processing dimension and by an alignment precision rougher than the second minimum processing dimension with respect to the first semiconductor portion. Next, it forms a plurality of second contacts connected to the second semiconductor portion by connection to the first contacts.

To attain the first object, according to a sixth aspect of the present invention, there is provided a memory device having a peripheral circuit portion, a memory portion having a plurality of memory cells stacked above the peripheral circuit portion, and contact portions connecting the peripheral circuit portion and the memory portion, wherein the memory portion has a plurality of first interconnects extending in a first direction and a plurality of second interconnects extending in a direction different from the first direction, regions where the first interconnects and the second interconnects intersect correspond to individual memory cells, the contact portions being arranged in at least two columns in the direction in which the first interconnects extend for contact portions connecting the first interconnects and the peripheral circuit portion and being arranged in at least two columns in the direction in which the second interconnects extend for the contact portions connecting the second interconnects and the peripheral circuit portion.

That is, the memory device of this aspect of the present invention has a structure wherein the peripheral circuit portion and the memory portion are stacked.

The memory portion has a plurality of first interconnects extending in the first direction and a plurality of second interconnects extending in a direction different from the first direction. Regions where the first interconnects and the second interconnects intersect correspond to individual memory cells.

Here, the contact portions connecting the first interconnects and the peripheral circuit portion are arranged in at least two columns in the direction in lo which the first interconnects extend, and the contact portions connecting the second interconnects and the peripheral circuit portion are arranged in at least two columns in the direction in which the second interconnects extend.

Preferably, the peripheral circuit portion is formed by the first minimum processing dimension, and the memory portion is formed by the second minimum processing dimension smaller than the first minimum processing dimension.

More preferably, in the regions where the first interconnects and the second interconnects intersect, 2-terminal devices are formed connected to the first interconnects and the second interconnects. These 2-terminal devices corresponds individual memory cells.

Still more preferably, the 2-terminal device is a resistor layer or a stack of a resistor layer and a switching layer.

To attain the first object, according to a seventh aspect of the present invention, there is provided a memory device having a peripheral circuit portion, a memory portion having a plurality of memory cells stacked above the peripheral circuit portion, and contact portions for connecting the peripheral circuit portion and the memory portion, wherein the memory portion has a plurality of first interconnects extending in a first direction and a plurality of second interconnects extending in a direction different from the first direction, regions where the first interconnects and the second interconnects intersect corresponding to individual memory cells, and a single layer made of a material having a resistance value changing by recording or a stack of the material having a resistance value changing by recording and a switching layer operating in a single layer is formed in the regions where the first interconnects and the second interconnects intersect connected to the first interconnects and the second interconnects.

That is, the memory device of this aspect of the present invention has a structure wherein the peripheral circuit portion and the memory portion are stacked.

The memory portion has a plurality of first interconnects extending in the first direction and a plurality of second interconnects extending in a direction different from the first direction. Regions where the first interconnects and the second interconnects intersect correspond to individual memory cells.

Here, in the regions where the first interconnects and the second interconnects intersect, a single layer made of a material having a resistance value changing by recording or a stack of the material having a resistance value changing by recording and a switching layer operating in a single layer is formed connected to the first interconnects and the second interconnects.

To attain the first object, according to an eighth aspect of the present invention, there is provided a method of production of a memory device comprising a step of forming a peripheral circuit portion on a semiconductor substrate; a step of forming a plurality of first contacts connected to the peripheral circuit portion; a step of forming a memory portion having a plurality of first interconnects extending in a first direction and a plurality of second interconnects extending in a direction different from the first direction, regions where the first interconnects and the second interconnects intersect corresponding to individual memory cells, stacked above the peripheral circuit portion; and a step of forming a plurality of second contacts connected to the first interconnects and the second interconnects of the memory portion by connection to the first contacts, the method further comprising arranging the positions of the second contacts and the first contacts connected to the first interconnects in at least two columns in the direction in which the first interconnects extend and arranging the positions of the second contacts and the first contacts connected to the second interconnects in at least two columns in the direction in which the second interconnects extend.

That is, the method of production of a memory device of this aspect of the present invention forms the peripheral circuit portion on the semiconductor substrate, then forms a plurality of first contacts connected to the peripheral circuit portion. Next, above the peripheral circuit portion, it forms a memory portion having a plurality of first interconnects extending in the first direction and a plurality of second interconnects extending in the direction different from the first direction, regions where the first interconnects and second interconnects intersect corresponding to individual memory cells, by stacking. Next, it forms a plurality of second contacts connected to the first interconnects and second interconnects of the memory portion by connection to the first contacts.

At this time, it arranges positions of the second contacts and the first contacts connected to the first interconnects in at least two columns in the direction in which the first interconnects extend and arrange the positions of the second contacts and the first contacts connected to the second interconnects in at least two columns in the direction in which the second interconnects extend.

Preferably, the peripheral circuit portion is formed by a first minimum processing dimension, and the memory portion is formed by a second minimum processing dimension smaller than the first minimum processing dimension.

Alternatively, the step of forming the memory portion includes a step of forming the first interconnects, a step of forming devices constituting the memory cells so as to be connected to the first interconnects in at least regions corresponding to individual memory cells, and a step of forming second interconnects so as to be connected to the devices.

More preferably, as the devices constituting the memory cells, 2-terminal devices are formed.

Still more preferably, as a 2-terminal device, a resistor layer or a stack of a resistor layer and a switching layer is formed.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, an explanation will be given of embodiments of a memory device of the present invention and a method of production and method of use of the same with reference to drawings.

First Embodiment

Figure 1:
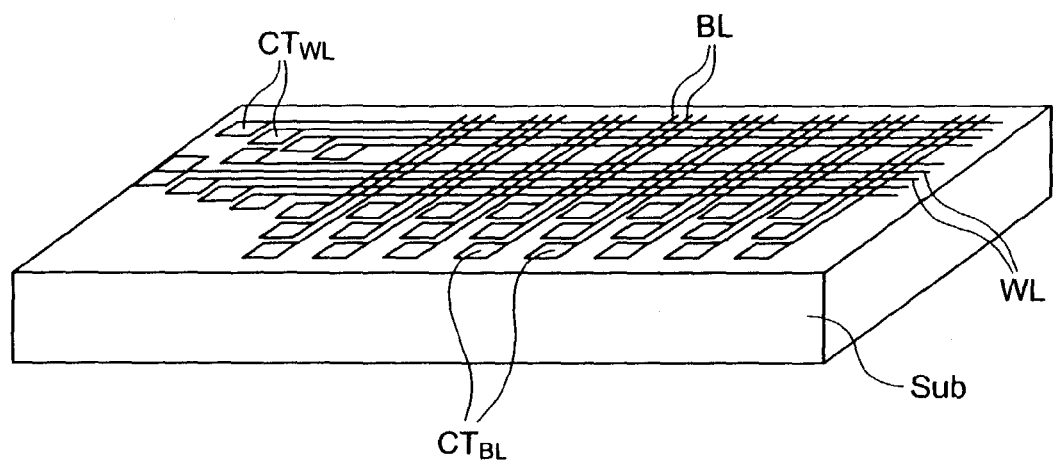
FIG. 1 is a perspective view of a memory device according to a first embodiment.

FIG. 1 is a perspective view of a memory device according to a first embodiment using a semiconductor or the like as a memory material.

A peripheral circuit portion is formed on a semiconductor substrate Sub. A memory portion including word lines WL and bit lines BL is stacked above it via for example an insulating film. The memory portion and the peripheral circuit portion are connected by contact portions such as word line contacts $CT_{WL}$ and bit line contacts $CT_{BL}$.

The peripheral circuit portion is formed on for example the silicon semiconductor substrate using conventionally known lithography technology by a first minimum processing dimension. For example, it comprises circuits including MOS transistors, resistors, and capacitors, and other devices and excluding the memory portion in the memory device, that is, an address circuit, signal detection sense amplifier circuit, recording and/or reproduction pulse control circuit, etc. and, in accordance with need, a data encoder, a data decoder, an error correction, boosting, or other circuit and a buffer memory etc.

The memory portion is configured by a plurality of memory cells arranged in a matrix form and is formed by for example soft lithography, interference exposure, contact exposure, or another inexpensive microprocessing technology not a usual semiconductor process by a second minimum processing dimension smaller than the first minimum processing dimension.

Here, the memory portion is stacked with respect to the peripheral circuit portion by an alignment precision rougher than the second minimum processing dimension.

Figure 2:
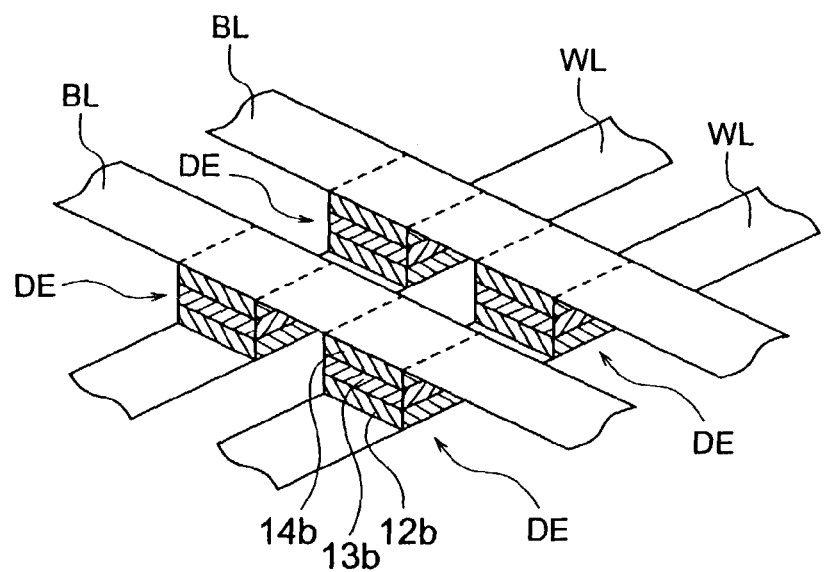
FIG. 2 is a schematic perspective view of memory cells in a memory portion of the memory device according to the first embodiment.

FIG. 2 is a schematic perspective view of memory cells in the memory portion. Four memory cells are shown in the figure. The intersecting regions where the bit lines BL and the word lines WL extend so as to intersect with each other become memory cells.

In each memory cell, the word line WL and the bit line BL are provided between them with a recording layer made of a recording material and, according to need, a selection switch layer arranged in series with respect to the recording layer and functioning as a diode or the like or a barrier layer made of a barrier material and so on. For example, the memory cell is constituted by a stack of a barrier layer 12b, a recording layer 13b, a barrier layer 14b, etc.

Both of the recording layer and selection switch are made of 2-terminal devices DE having two terminals.

As the recording material constituting the recording layer in each memory cell, use is made of a magnetoresistive material, a phase change material, a fuse material, anti-fuse material, or other resistance change material, ferroelectric, dielectric, or other charge holding or capacity changing material, etc.

As the magnetoresistive material, use is made of a magnetoresistive material of a structure comprised of a Cu or other conductive thin film on the two sides of which an NiFe, Co, CoFe, or other ferromagnetic thin film is arranged, that is, a so-called "giant magnetoresistive" (GMR) structure, or a magnetoresistive material of a structure comprised of an $Al_2O_3$ insulating thin film on the two sides of which an NiFe, Co, CoFe, or other ferromagnetic thin film is arranged, that is, a so-called "tunnel magnetoresistive" (TMR) structure.

Data is recorded by passing a current through the bit line and the word line corresponding to the desired cell and inverting the direction of magnetization of the recording cell by the magnetic field formed by the current.

Data is reproduced by applying voltage between the bit line and the word line corresponding to the desired cell and identifying the data by the value of the current passing through the GMR or TMR device, that is, the change of the resistance.

Here, the GMR or the TMR device creates a difference in the value of the resistance according to whether the magnetization directions of the two types of magnetic films arranged in parallel are parallel or anti-parallel, so data can be reproduced by the above method.

As a phase change material, GeSbTe or AgInSbTe or another chalcogenide semiconductor comprised of Ge, Si, Ag, In, Sn, Sb, Te, Se, As, Bi, or the like is used.

These materials have the characteristics of easy phase shift between the crystal and amorphous states according to a temperature change and a low resistance in the crystal state and a high one in the amorphous state in the storage and reproduction states.

In recording, a pulse current is passed to the desired cell to heat the recording material to a temperature of at least the crystallization temperature and not more than the melting point. Due to this, a crystallization state is obtained after the recording. By passing a pulse current shorter and larger than the current pulse causing the crystallization and heating the material to more than the melting point, then rapidly cooling, the amorphous state can be obtained after the recording.

The effect of The Joule heat caused by the current flowing through the resistor is used for the heating. As the resistor, it is also possible to use the chalcogenide material per se or also possible to use a TiN, WN, TaN, MoN, TiO, WO, TaO, MoO, or other thin film resistance material separately arranged in series.

To prevent a reaction between the metal interconnect material and the chalcogenide material due to heating and movement of atoms between the two materials, it is also possible to form a barrier layer comprised of a nitride material or an oxide material.

As a so-called write-once type recording material capable of recording only once, there are a fuse material and an anti-fuse material.

A fuse material is for example made of a polycrystalline silicon, nichrome, or other thin film resistor. Data is recorded by a breaking the resistor by the Joule heat of the recording current.

An anti-fuse material is for example made of an amorphous silicon, polycrystalline silicon, and metal (semiconductor)/thin insulating film/metal (semiconductor), or other amorphous material or a metal thin film via an insulating material. Data is recorded by passing a recording current so promote crystallization,in the case of an amorphous material or cause insulation breakdown in the case of an insulating material and thereby lower the resistance value.

Other than a resistance change material, in order to prevent a damage to the metal interconnects due to heating, it is also possible to add a barrier layer made of a nitride material or oxide material between the interconnect material and the resistance change material.

In the case of a ferroelectric, data is recorded by applying voltage to the desired cell to invert the polarization.

Data is also recorded by applying voltage to the dielectric capacitor to store a change. Data is reproduced by applying voltage to the desired cell and identifying the data by the presence of current accompanying inversion of the polarization or movement of the charge.

In order to prevent deterioration at the time of repeated recording and reproduction accompanying movement of atoms at an interface between the ferroelectric material and the interconnect material, it is also possible to add an RuO, IrO$_2$, or other barrier layer to the interface.

Next, the method of production of the memory device according to the present embodiment will be explained.

The peripheral circuit portion on the silicon substrate is formed by the first minimum processing dimension using conventionally known usual lithography technology for producing a semiconductor.

For example, it is formed by a processing method having a high alignment precision by for example a process having a minimum processing line width F=0.18 to 0.25 μm using a KrF laser, a process of F=0.10 to 0.15 μm using an ArF laser, or a process of about 0.10 μm using an F$_2$ laser and further a process of 0.10 μm or less using a light source referred to as extreme UV light, an electron beam, X-ray, or the like.

Next, the silicon substrate on which the above peripheral circuit portion is formed is formed with memory cells by the second minimum processing dimension smaller than the first minimum processing dimension by inexpensive microprocessing technology not of the usual semiconductor process.

Here, the "inexpensive microprocessing technology not of the usual semiconductor process" means a processing method using soft lithography, interference exposure, contact exposure, or another method and not requiring high precision alignment, for example, entailing an alignment precision rougher than the minimum processing line width.

Below, as a representative example of the above materials, a case of use of an anti-fuse material, that is, amorphous silicon, as the recording material will be explained.

Figure 3:
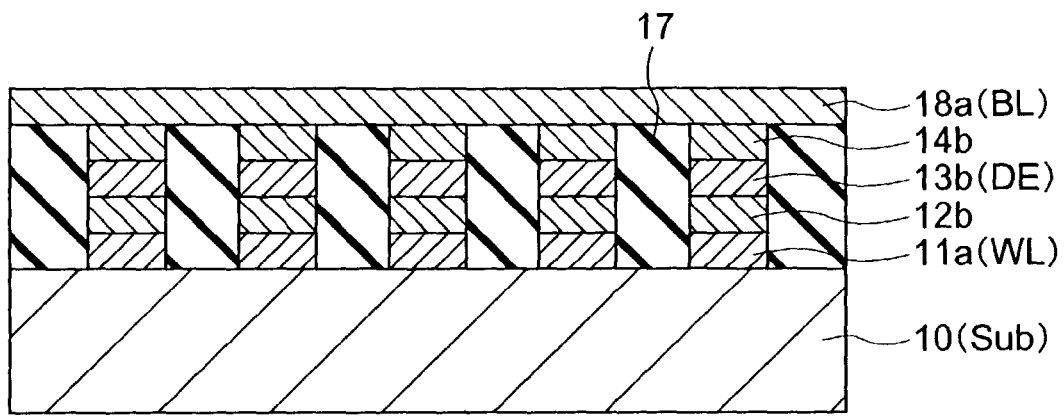
FIG. 3 is a sectional view along an extending direction of a bit line in the memory portion of the memory device according to the first embodiment.

FIG. 3 is a sectional view along an extending direction of a bit line in the memory portion of a memory device according to the present embodiment.

A peripheral circuit portion (not illustrated) is provided on the semiconductor substrate 10 (Sub). A first interconnect 11a forming a word line WL is formed above this via an insulating film or the like.

In each memory cell region, above the first interconnect 11a, a barrier layer 12b made of for example silicon nitride, a recording layer 13b made of amorphous silicon and forming a 2-terminal device DE, and a barrier layer 14b made of for example silicon nitride or titanium nitride are stacked. The regions other than the memory cells are buried by an inter-layer insulating film 17.

Further, a second interconnect 18a forming a bit line BL is formed above the barrier layer 14b.

The barrier layers 12b and 14b may be made of the same material or different materials.

Here, the thin films of the silicon nitride forming the barrier layers 12b and 14b are insulative, but can be reduced in thickness to for example about 5 to 50 nm to reduce the nitrogen content and thereby make the stack act as an MIM diode.

Also, the titanium nitride thin film is a conductor. Here, it acts as a simple barrier layer.

The method of production of a memory cell having the above structure will be explained next.

Figure 4A:
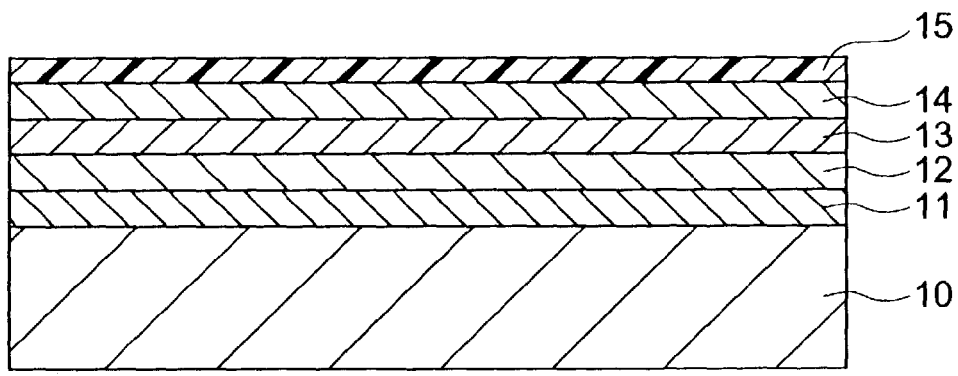
FIGS. 4A and 4B are sectional views of steps of a method of production of a memory device according to the first embodiment.

First, a silicon semiconductor substrate 10 formed in advance by the usual semiconductor processes with peripheral circuits other than the cell portions required for operating the memory, for example, an address selection circuit, a signal detection circuit, a data input and output circuit, a recording pulse control circuit, and a reproduction pulse control circuit, has a conductive layer 11 for forming the first interconnects (word lines) deposited on it by for example sputtering as shown in FIG. 4A.

The material is Al, Cu, Au, Ag, or the like having a small resistance. It is also possible to have some additives mixed in to improve electromigration or reliability of the bonding etc.

Next, for example chemical vapor deposition (CVD) etc. is used to deposit silicon nitride to form the barrier layer 12, to deposit amorphous silicon to form the recording layer 13, and to deposit titanium nitride to form the barrier layer 14.

Next, the barrier film 14 is coated with a resist film 15.

Figure 4B:
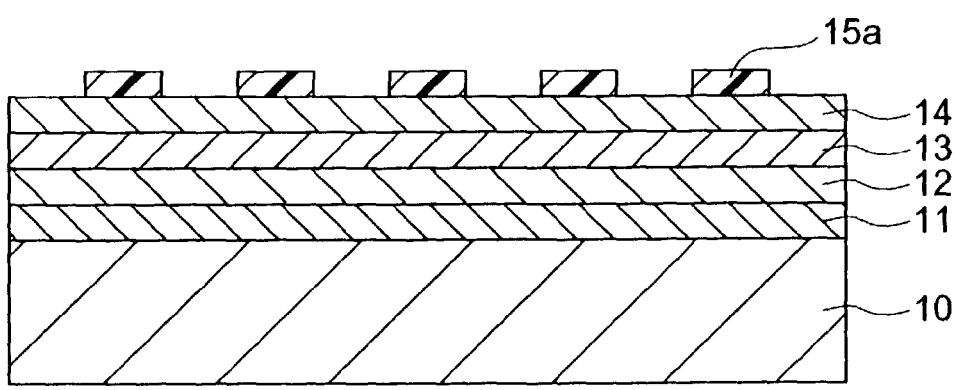

Next, as shown in FIG. 4B, soft lithography, interference exposure, contact exposure, or other inexpensive microprocessing technology is used to obtain a resist film 15a patterned by the second minimum processing dimension. The resist film 15a is a layer forming a mask for patterning the lower barrier layer 14, recording layer 13, barrier layer 12, and conductive layer 11 in the first interconnect (word line) direction.

Here, in soft lithography, interference exposure, contact exposure, and other microprocessing technology, high precision alignment such as with respect to the peripheral circuit portion is unnecessary. The pattern is formed by an alignment precision rougher than the second minimum processing dimension.

The above "high precision" designates a precision smaller than, for example, about 20% of, the microprocessing minimum size.

As a representative case of the above microprocessing process, a method of patterning a resist film by soft lithography (imprint method) will be explained by referring to FIGS. 5A and 5B.

Figure 5A:
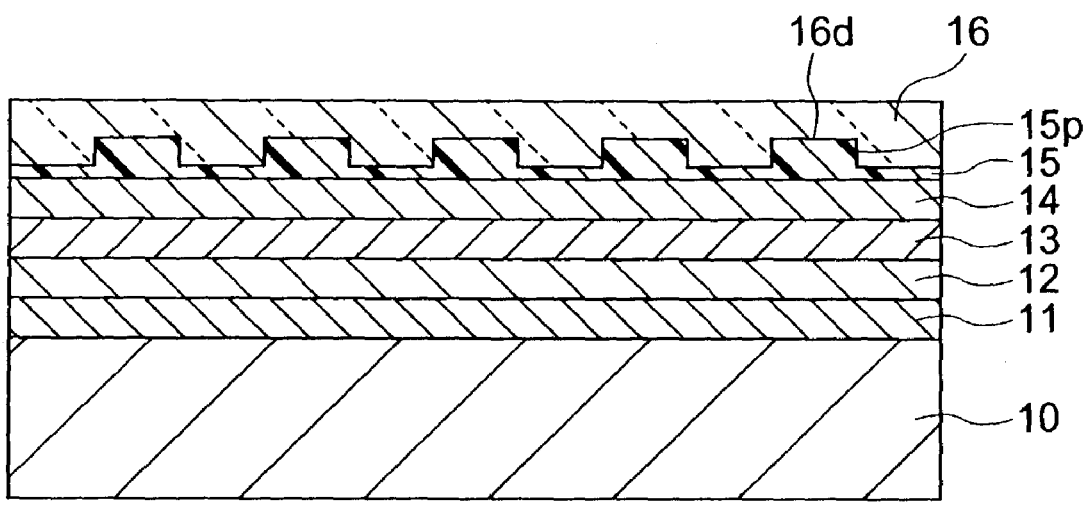
FIGS. 5A and 5B are sectional views of a patterning method using soft lithography (imprint method)

As shown in FIG. 5A, a stamper 16 formed on its surface with a microprocessing pattern is brought into contact with the processed substrate on which the resist film 15 is coated.

Here, the stamper 16 is made of for example a sheet of a plastic or inorganic material having a thickness of about 0.1 to 1 mm.

The microprocessing pattern on the surface may be formed using an electron beam lithography system etc. or obtained by transferring a pattern to the stamper material by plating, molding, etc. from a master formed by this.

As described above, the relief pattern provided on the stamper 16 is transferred to the resist film 15. Namely, projections 15p of the resist film 15 are formed at depressions 16d of the stamper 16.

At the time of transfer, suitable temperature and pressure are applied.

In the state where the stamper 16 is pressed against the resist film 15 as described above, when the resist film 15 has an ultraviolet curing property, ultraviolet light is irradiated via the stamper 16 to cause the resist film 15 to cure. In this case, as the stamper 16, use is made of glass, plastic, or another transparent material.

When the resist film 15 has a heat curing property, heat is applied via the stamper 16 to cause the resist film 15 to cure.

Figure 5B:
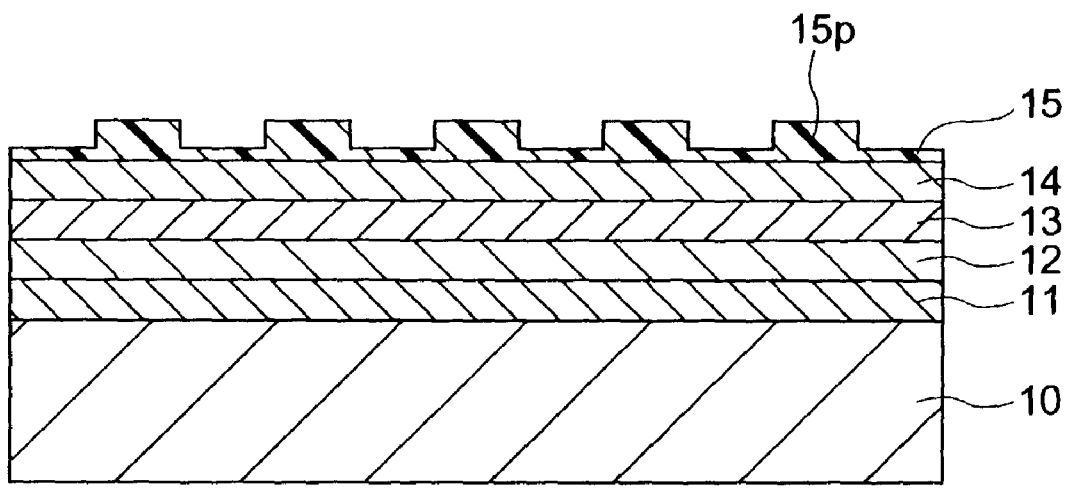

After causing the resist film 15 to cure in the above way, the stamper 16 is peeled off, whereby, as shown in FIG. 5B, the relief pattern including the projections 15p is transferred to the surface of the resist film 15.

From this state, reactive ion etching (RIE), plasma etching, wet etching, ion milling, or another etching method is applied to completely remove the thin parts between projections 15p of the resist film and reach the state of FIG. 4B.

As the method of patterning the resist film 15a by the above microprocessing methods, other than the imprint method, interference exposure or contact exposure may also be used.

Further, conversely to the procedure of forming a film and then processing a resist above it, it is also possible to pattern the resist, then form the film and later remove the resist and the unnecessary film deposited above the resist, i.e., pattern the film by so-called lift-off.

Figure 6A:
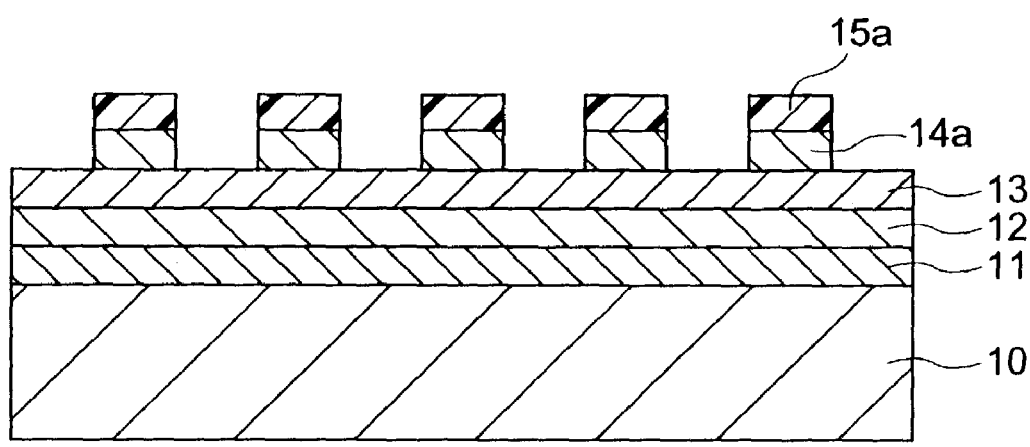
FIGS. 6A and 6B are sectional views of steps continuing from to FIG. 4B.

After patterning the resist film 15a as described above, as shown in FIG. 6A, an etching method giving a high selectivity of etching between the resist film 15a and the barrier layer 14, for example, RIE, is used to etch the barrier layer 14 and thereby obtain the barrier layer 14a processed to the pattern of the resist film 15a.

Figure 6B:
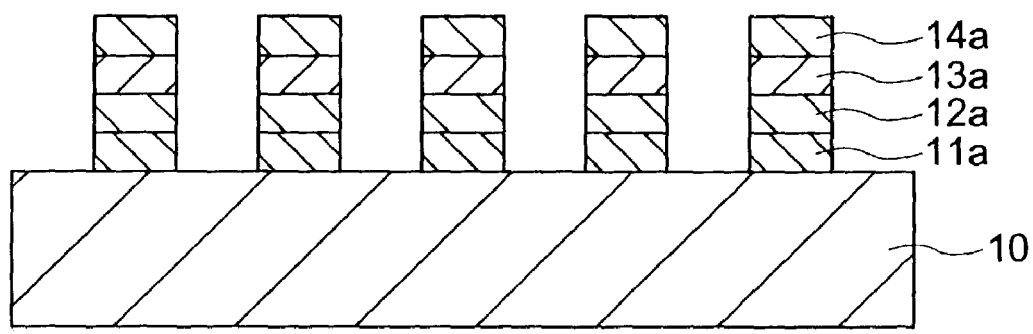

Next, as shown in FIG. 6B, the resist film 15a is used as a mask to etch the recording layer 13, barrier layer 12, and conductive layer 11 and thereby obtain the recording layer 13a, barrier layer 12a, and first interconnects (word lines) 11 processed to the pattern of the resist film 15a. Thereafter, the resist film 15a is removed.

The selectivities of etching of the recording layer 13, barrier layer 12, and conductive layer 11 should be ones sufficient between these materials and the resist film 15a, but if not, there is no obstacle in the process so long as selectivities can be secured between these materials and the barrier layer 14a.

Figure 7A:
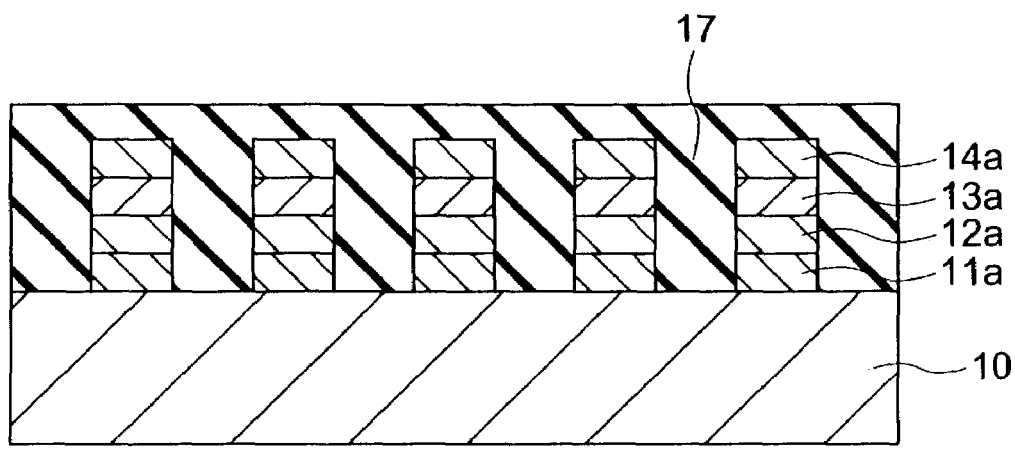
FIGS. 7A and 7B are sectional views of steps continuing from FIG. 6B.

Next, as shown in FIG. 7A, an organic insulating material or spin-on-glass (SOG) is coated by for example spin coating and cured or $SiO_2$, SiOF, or another so-called "low-k" material is uniformly deposited by CVD or the like to bury the spaces among the processed first interconnects 11a, barrier layer 12a, recording layer 13a, and barrier layer 14a by an insulating material and thereby to form the inter-layer insulating film 17.

Figure 7B:
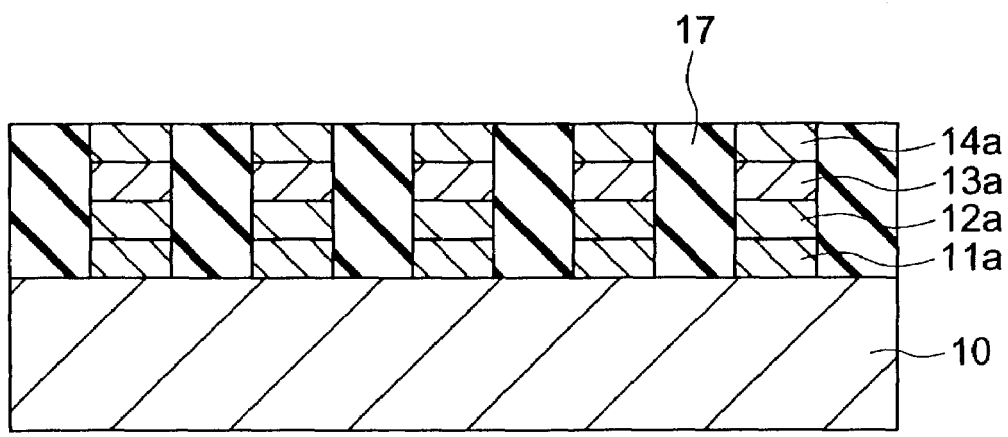
Figure 8A:
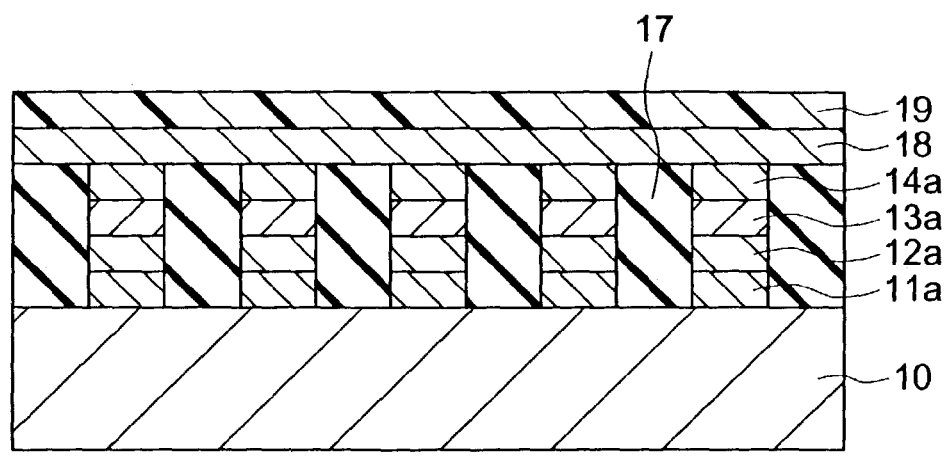
FIGS. 8A and 8B are sectional views of steps continuing from FIG. 7B.
Figure 8B:
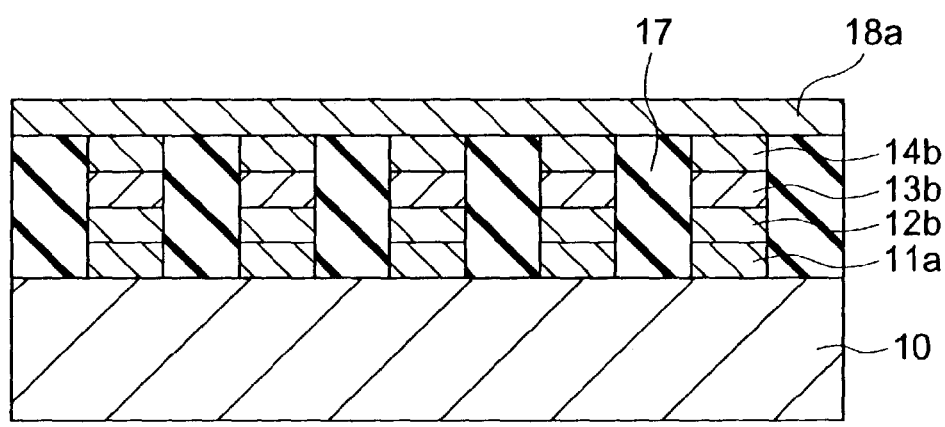

Next, as shown in FIG. 7B, for example chemical mechanical polishing (CMP) is used to remove and smooth the inter-layer insulating film 17 until the surface of the barrier layer 14a is exposed.

Next, as shown in FIG. BA, for example sputtering etc. is used to deposit the conductive layer 18 forming the second interconnects (bit lines). As the material, a material similar to that used for the first interconnects (word lines) 11a can be used.

Next, in the same way as that described above, soft lithography, interference exposure, contact exposure, or another inexpensive microprocessing technology is used to obtain a resist film 19 patterned by the second minimum processing dimension. The resist film 19 is the layer forming the mask for patterning the lower conductive layer 18, barrier layer 14a, recording layer 13a, and barrier layer 12a in the direction of the second interconnects (bit lines) perpendicular to the first interconnects (word lines).

Here, in soft lithography, interference exposure, contact exposure, and other microprocessing technology, high precision alignment such as with respect to the peripheral circuit portion is unnecessary. The pattern is formed by an alignment precision rougher than the second minimum processing dimension.

Next, the resist film 19 is used as the mask for RIE or other etching to successively process the conductive layer 18, barrier layer 14a, recording layer 13a, and barrier layer 12a to obtain the patterned second interconnects (bit lines) 18a, barrier layer 14b, recording layer 13b, and barrier layer 12b.

Thereafter, the resist film 19 is removed and the spaces between memory cells caused due to the patterning are buried by an insulating material to thereby enable the production of the memory portion of a memory device according to the present embodiment shown in FIG. 3.

The word lines WL and the bit lines BL to be connected to the memory cells produced as described above are connected to the peripheral circuits on the silicon substrate.

In the related art, the contact portions to be connected to the word lines or bit lines exposed on the silicon substrate are aligned with by a high precision for microprocessing of the word lines or bit lines. In the present embodiment, however, this high precision alignment is not required.

First, alignment of the peripheral circuit portion and the memory portion in a case of forming the memory portion by soft lithography, contact exposure, or other microprocessing technology will be explained.

Figure 9:
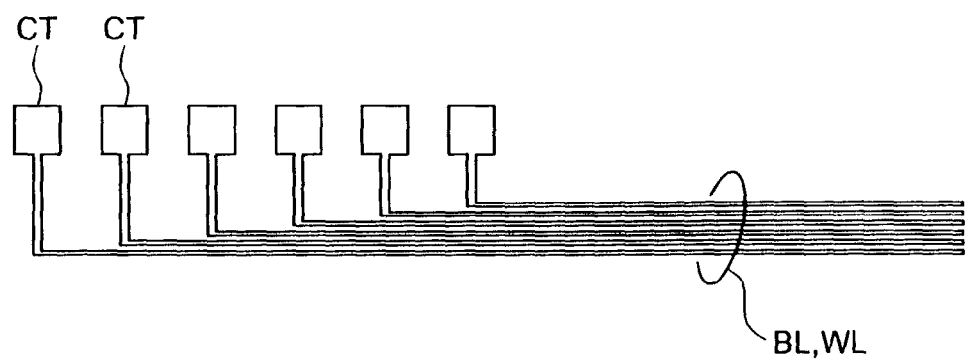
FIG. 9 is an enlarged view of word line contacts or bit line contacts or other contact portions of a memory device according to the first embodiment.

FIG. 9 is an enlarged view of word line contacts, bit line contacts, or other contact portions CT connected to the word lines WL or the bit lines BL.

Each of the word line contacts, bit line contacts, or other contact portions CT is connected to one interconnect among the word lines WL or the bit lines BL. From here on, for convenience, these will also be referred to as "second contacts $CT_2$".

Figure 10A:
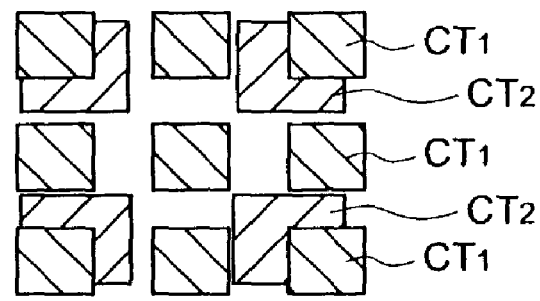
FIG. 10A is a plan view of an example of the layout of word line contacts or bit line contacts or other contact portions.

FIG. 10A is a plan view of an example of the layout of word line contacts, bit line contacts, or other contact portions.

As shown in FIG. 10A, contacts connected to the peripheral circuit portion provided on the silicon substrate (hereinafter referred to as the "first contacts $CT_1$" for convenience) and the second contacts $CT_2$ connected to the word lines WL or the bit lines BL are connected.

Here, a larger number of the first contacts $CT_1$ are provided than the number of the second contacts $CT_2$, each of the second contacts $CT_2$ is connected to at least one first contact $CT_1$, and each of the first contacts $CT_1$ is connected to at most one second contact $CT_2$.

Figure 10B:
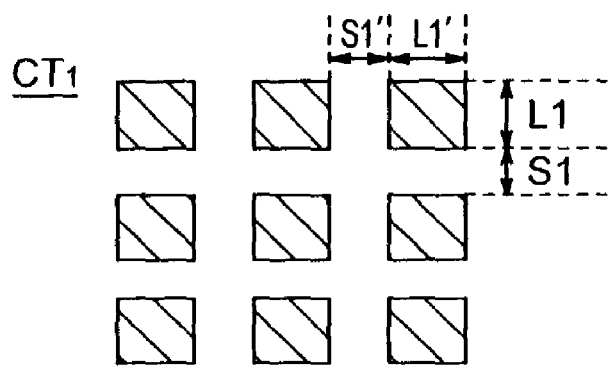
FIG. 10B is a plan view of first contacts.
Figure 10C:
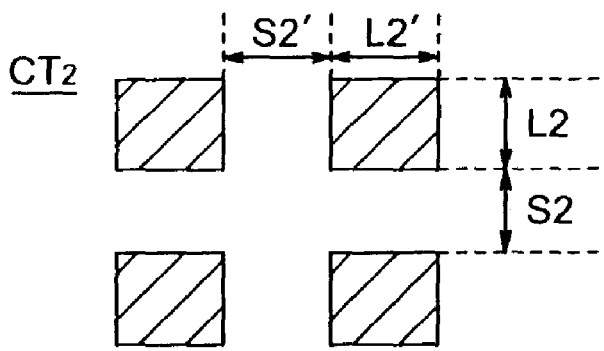
FIG. 10C is a plan view of second contacts.

FIG. 10B is a plan view of the first contacts $CT_1$, and FIG. 10C is a plan view of the second contacts $CT_2$.

As shown in FIG. 10B, the first contacts $CT_1$ have rectangular shapes and are arranged in a one-dimensional or two-dimensional direction of arrangement cyclically repeating by for example a cycle equivalent to or more than the design rule of the peripheral circuit portion formed on the silicon substrate, that is, the first minimum processing dimension.

Also, as shown in FIG. 10C, the second contacts $CT_2$ have rectangular shapes and are arranged in the same direction of arrangement as the direction of arrangement of the first contacts $CT_1$ cyclically repeating by a cycle larger than the design rule of for example the memory portion, that is, the second minimum processing dimension.

Here, a length L1 of the first contacts $CT_1$ and space S1 between said first contacts $CT_1$ and a length L2 of the second contacts $CT_2$ and space S2 between said second contacts $CT_2$ are in the relationships of the following inequalities (1) and (2) for the direction of arrangements of the first contacts $CT_1$ and the second contacts $CT_2$:

$$L1 < S2 \tag{1}$$

$$S1 < L2 \tag{2}$$

In the first contacts $CT_1$ and the second contacts $CT_2$ arranged with the above sizes, even if the precision of the alignment between the first contacts $CT_1$ and the second contacts $CT_2$ ends up becoming rougher than the second minimum processing dimension, each of the second contacts $CT_2$ is reliably connected to at least one first contact $CT_1$, and each of the first contacts $CT_1$ is connected to at most one second contact $CT_2$, that is, is never connected to a plurality of second contacts $CT_2$.

On the other hand, when forming the memory portion by interference exposure, since interference exposure only allows formation of a pattern of lines and spaces of the same cycle, the contacts are connected by the method explained below.

Figure 11A:
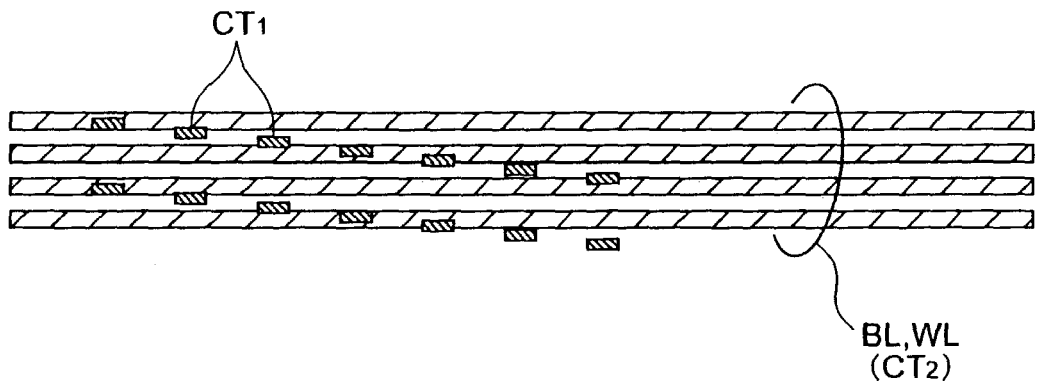
FIG. 11A is a plan view of another example of the layout of word line contacts or bit line contacts or other contact portions.

FIG. 11A is a plan view of another example of the layout of word line contacts, bit line contacts, and other contact portions.

As shown in FIG. 11A, the first contacts $CT_1$ connected to the peripheral circuit portion provided on the silicon substrate and the second contacts $CT_2$ constituted by the extended portions of the word lines WL or bit lines BL are connected.

In the same way as the contacts of FIG. 10, the number of the first contacts $CT_1$ provided is larger than the number of the second contacts $CT_2$, each of the second contacts $CT_2$ is connected to at least one first contact $CT_1$, and each of the first contacts $CT_1$ is connected to at most one second contact $CT_2$.

Figure 11B:
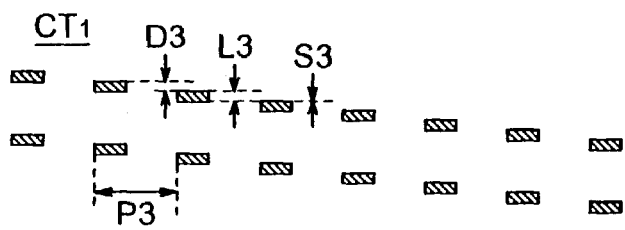
FIG. 11B is a plan view of the first contacts.
Figure 11C:
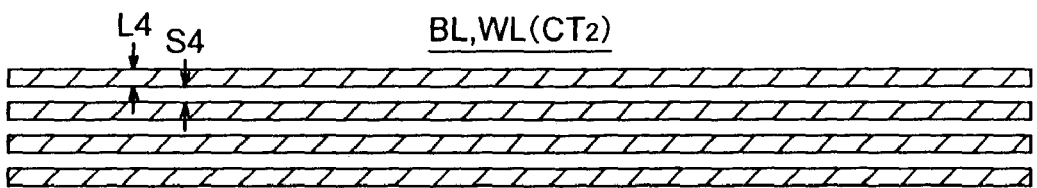
FIG. 11C is a plan view of the second contacts.

FIG. 11B is a plan view of the first contacts $CT_1$, and FIG. 11C is a plan view of the second contacts $CT_2$.

As shown in FIG. 11C, the second contacts $CT_2$ are constituted by the extended portions of the word lines WL or bit lines BL, have shapes of straight lines, and are arranged cyclically repeating by the design rule of for example the memory portion, that is, the second minimum processing dimension.

On the other hand, as shown in FIG. 11B, the first contacts $CT_1$ have rectangular shapes and are arranged cyclically repeated in a direction of arrangement perpendicular to the direction of arrangement of the second contacts while shifted by increments of a predetermined distance (D3) in the direction of arrangement of the second contacts.

Here, a space S3, with respect to the direction of arrangement of the second contacts $CT_2$, between two first contacts $CT_1$ formed adjacent to each other in said direction of arrangement perpendicular to the direction of arrangement of the second contacts $CT_2$ and length L3 of said first contacts $CT_1$ with respect to the direction of arrangement of the second contacts $CT_2$ and a length L4 of said second contacts $CT_2$ and a space S4 between said second contacts $CT_2$ are in the relationships of the following inequalities (3) and (4):

$$L3 < S4 \quad (3)$$

$$S3 < L4 \quad (4)$$

The length L3 of the first contacts $CT_1$ with respect to the direction of arrangement of the second contacts $CT_2$ has to be smaller than the design rule of the second contacts $CT_2$, that is, the second minimum processing dimension. When for example the second minimum processing dimension (line/space) is about 0.05 μm, the length L3 of the first contacts $CT_1$ must be made narrower than 0.025 μm. For the direction of arrangement perpendicular to the direction of arrangement of the second contacts $CT_2$, however, a pitch P3 of the first contacts $CT_1$ can be set to the first minimum processing dimension larger than the second minimum processing dimension, therefore, the pattern can be formed relatively easily. A process where the cycle is loose, but the processing line width is narrow is already used in the production process of conventional DRAMs etc.

In the first contacts $CT_1$ and the second contacts $CT_2$ arranged with the above sizes, even if the precision of the alignment between the first contacts $CT_1$ and the second contacts $CT_2$ ends up becoming rougher than the second minimum processing dimension, each of the second contacts $CT_2$ is reliably connected to at least one first contact $CT_1$, and each of the first contacts $CT_1$ is connected to at most one second contact $CT_2$, that is, is never connected to a plurality of second contacts $CT_2$.

By using the contact method as shown in FIGS. 10A to 10C and FIGS. 11A to 11C described above, even if high precision alignment is not applied, it becomes possible to connect the contact portions of the peripheral circuit portion on the silicon substrate and the contacts of the word lines or bit lines of the memory portion.

Note that the locations of contacts are not decided on one to one in advance as in a conventional memory device, therefore a new control algorithm and circuits become necessary in the operation of the memory device.

For example, the method may be considered of checking the state of connection of the contact portions and changing and assigning addresses to memory cells constituting the memory portion in the address circuit formed as a peripheral circuit on the silicon substrate in the inspection process before shipping the memory device or forming a control algorithm which can operate under any contact situation in the peripheral circuit on the silicon substrate in advance.

Here, for changing the address circuit, the interconnect pattern is changed using for example a PROM formed on the silicon substrate.

Also, the method of judging the state of connection of the first contacts $CT_1$ and the second contacts $CT_2$ and assigning addresses to the memory cells constituting the memory portion when the user uses the memory device can be employed.

According to the memory device of the present embodiment, the peripheral circuit portion formed by the first minimum processing dimension and the memory portion formed by the second minimum processing dimension smaller than the first minimum processing dimension are stacked on each other in structure. The memory portion is stacked with respect to the peripheral circuit portion with an alignment precision rougher than the second minimum processing dimension. By stacking the peripheral circuit portion and the memory portion as separate layers in this way, a microprocessing method not needing high precision alignment and having a very small processing size can be employed for only the memory portion needing miniaturization for enlarging the capacity.

Particularly, by constituting the memory cells by 2-terminal devices, they can be easily produced by soft lithography, interference exposure, contact exposure, and other microprocessing technology giving very small processing sizes, but having bad alignment precision.

Also, by connecting the first contacts $CT_1$ connected to the peripheral circuit portion provided on the silicon substrate and the second contacts $CT_2$ connected to the word lines WL or the bit lines BL as shown in FIGS. 10A to 10C or FIGS. 11A to 11C, it becomes possible to connect the memory portion and the peripheral circuit portion without requiring high precision alignment.

Figure 12:
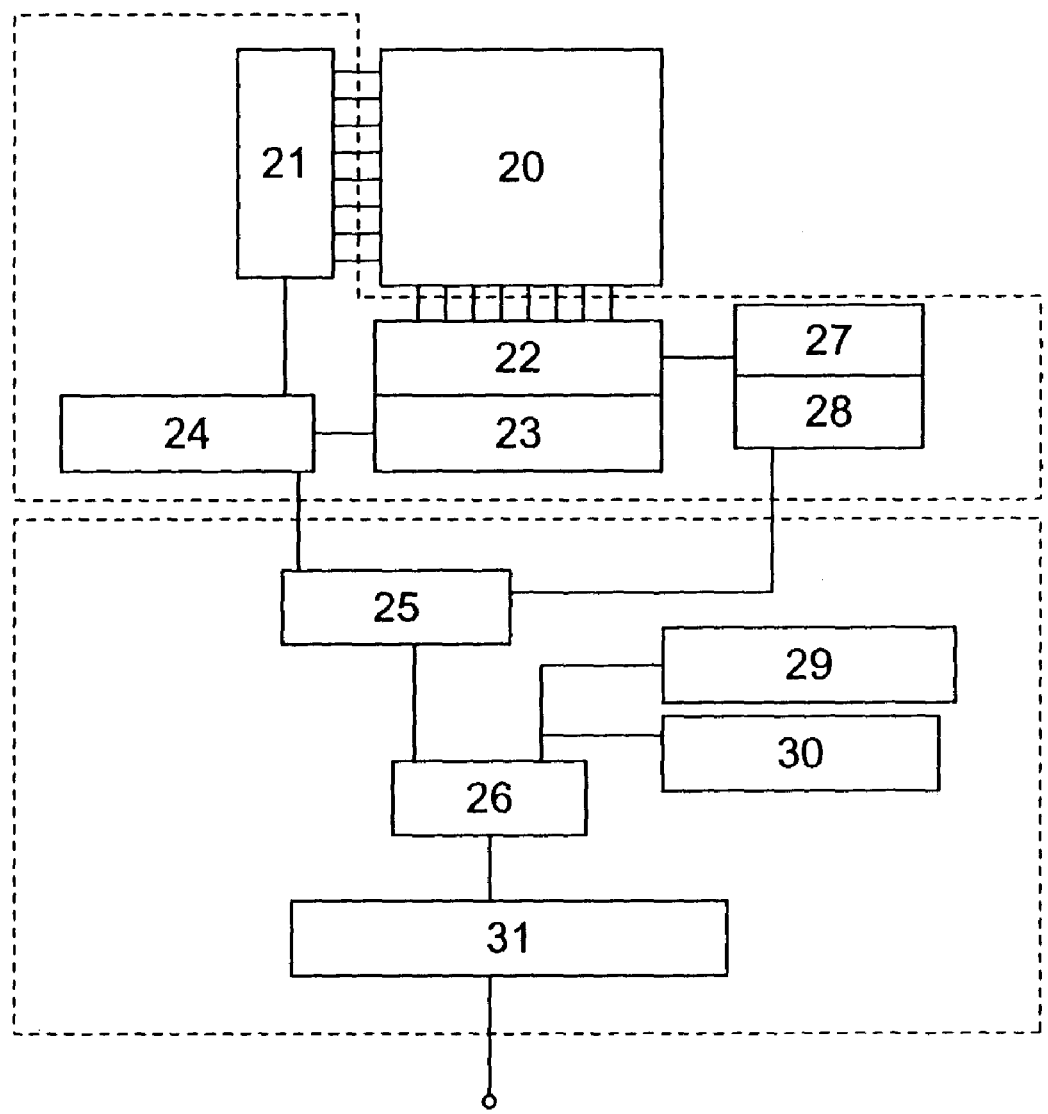
FIG. 12 is a block diagram showing a circuit configuration of the memory device according to the first embodiment.

FIG. 12 is a block diagram of a circuit configuration of a memory device according to the present embodiment.

The portions surrounded by the broken lines, that is, other than the memory portion 20, become the peripheral circuit portion formed on the silicon semiconductor substrate. The memory cell array, that is, the memory portion 20, is formed above this.

Though omitted in FIG. 12, it is assumed that a plurality of memory cell arrays are provided with respect to one memory device (memory chip). A plurality of memory cell arrays and peripheral circuits, that is, cell input/output circuits 22, read circuits 27, recording circuits 28, row decoders 21 and column decoders 23, and address selection circuits 24 are provided with respect to one memory device (memory chip).

It is possible to provide a single array selection circuit 25 for selecting one of these plurality of memory cell arrays, input/output interface 31 for transferring data with the outside, buffer memory 30 for temporarily storing data input from the outside or output to the outside, error correction circuit 29 for correcting error after the recording or at reading, control circuit 26 for controlling the array selection (address selection), error correction, and transfer of data or clocks between the buffer memory and the input/output interface, and other memory common circuits in the memory device (memory chip), that is, have them shared by the memory cell arrays. Note that it is also possible to employ a configuration providing a plurality of these circuits in the memory device (memory chip) or conversely possible to employ a configuration providing one memory cell array and peripheral circuits in the memory device (memory chip).

The contacts between the memory cell array and the peripheral circuits are important elements in the memory device according to the present embodiment. In the inspection process before the shipping of the memory device and when a user uses the memory device, the contacts between contact portions of a specific cell array, and further specific row and column decoders, on the silicon substrate and the contact portions of the cell array are inspected based on a contact inspection signal issued from the control circuit. Further, whether the memory cells function as a memory is inspected.

The inspection can be carried out by recording and reproduction in addition to electrical conduction. After the inspection, the address information or array information of the valid memory cells is stored in a memory provided in the peripheral circuits or a memory common circuit. As the memory used here, use can be made of a memory comprised of 2-terminal devices according to the present embodiment or a conventionally used SRAM, DRAM, flash memory, MRAM, FeRAM, fuse type or anti-fuse type memory, or other memory.

Second Embodiment

The memory device using a semiconductor etc. as a memory material according to the second embodiment is substantially the same as the memory device according to the first embodiment, but differs in the structure of the memory cells.

Figure 13:
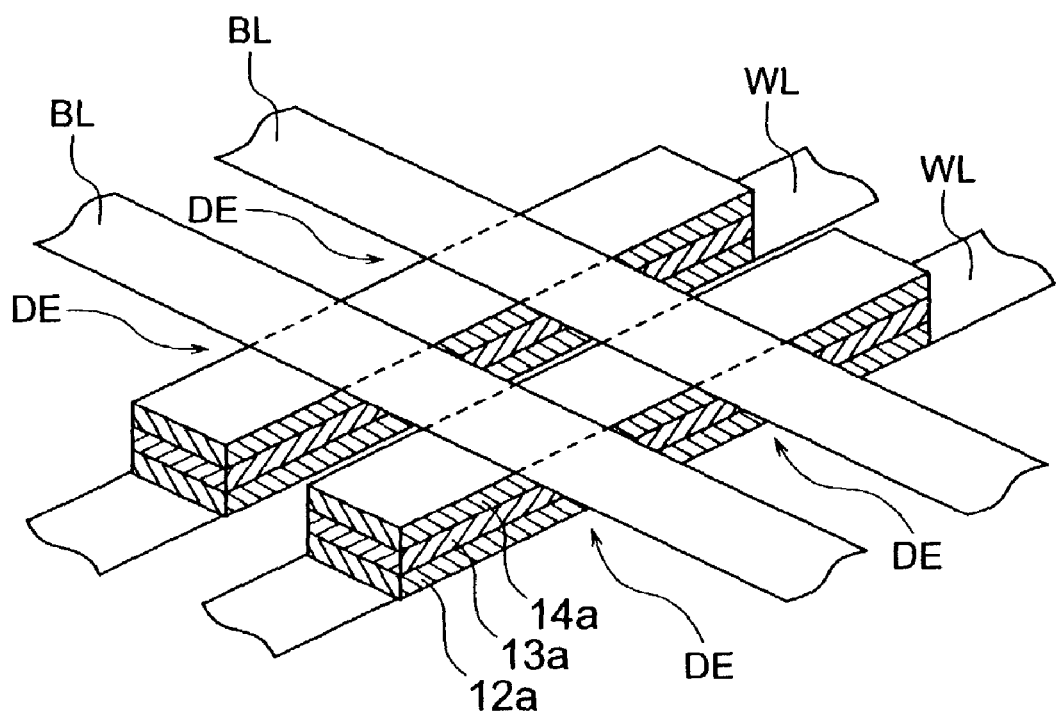
FIG. 13 is a schematic perspective view of memory cells in the memory portion of a memory device according to a second embodiment.

FIG. 13 is a schematic perspective view of the memory cells in the memory portion of a memory device according to the present embodiment. Four memory cells are shown in the figure.

In the memory device according to the first embodiment shown in FIG. 2, the barrier layer 12a, recording layer 13a, and barrier layer 14a constituting the memory cells are patterned for every cell so that adjacent cells are completely isolated from each other, but it is not always necessary to isolate cells. For example, a cell may be connected to a cell adjacent in the extending direction of a word line WL as in the memory device according to the present embodiment shown in FIG. 13. In this case, the portions in regions where the bit lines BL and word lines WL extending so as to intersect with each other intersect become the 2-terminal devices DE constituting the memory cells.

Note that, an adjacent cell has effects at the time of recording or at the time of reproduction, but by optimization of the recording pulse current or by elimination of the crosstalk signal or other tricks in signal detection, these effects can be avoided.

The memory device according to the present embodiment can be produced substantially in the same way as in the first embodiment.

Namely, after patterning the bit lines BL in the method of production of the memory device according to the first embodiment, the process is ended without etching the lower barrier layer 14a, recording layer 13a, and barrier layer 12a along the pattern of the bit lines BL.

In the memory device according to the present embodiment as well, in the same way as the first embodiment, the peripheral circuit portion formed by the first minimum processing dimension and the memory portion formed by the second minimum processing dimension smaller than the first minimum processing dimension are stacked over each other and the memory portion is stacked with respect to the peripheral circuit portion with an alignment precision rougher than the second minimum processing dimension. By stacking the peripheral circuit portion and the memory portion as separate layers in this way, a microprocessing method not needing high precision alignment and having a very small processing size can be employed for only the memory portion needing miniaturization for enlarging the capacity.

Third Embodiment

Figure 14:
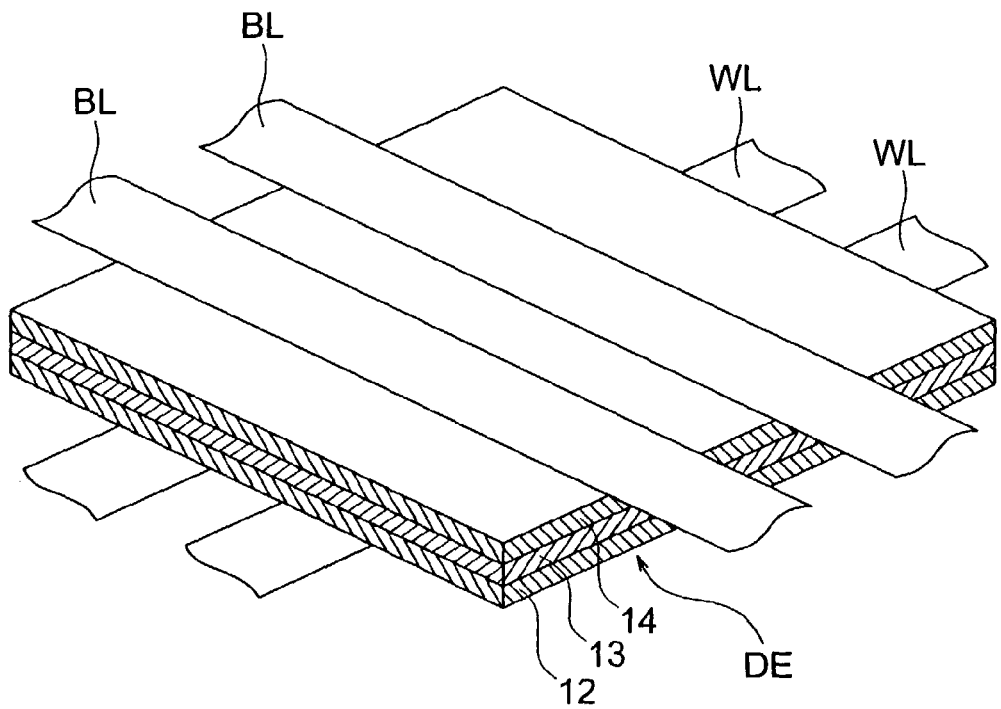
FIG. 14 is a schematic perspective view of memory cells in the memory portion of a memory device according to a third embodiment.

The memory device using a semiconductor etc. as a memory material according to the third embodiment is substantially the same as the memory device according to the first embodiment. FIG. 14 is a schematic perspective view of memory cells in the memory portion of a memory device according to the present embodiment.

Namely, the barrier layer 12, recording layer 13, and barrier layer 14 constituting the memory cells are not separated at all among cells. The layers are uniformly formed. In this case as well, the portions in regions where the bit lines BL and word lines WL extending so as to intersect with each other intersect become 2-terminal devices DE constituting the memory cells.

The memory device according to the present embodiment can be produced substantially in the same way as the first embodiment.

Namely, after depositing the conductive layer forming the word lines in the method of production of the memory device according to the first embodiment, the layer is first patterned to form the word lines, then the barrier layer 14, recording layer 13, and barrier layer 12 are successively deposited. The bit lines BL are formed on them without them being patterned.

In the memory device according to the present embodiment as well, in the same way as the first embodiment, the peripheral circuit portion formed by the first minimum processing dimension and the memory portion formed by the second minimum processing dimension smaller than the first minimum processing dimension are stacked over each other and the memory portion is stacked with respect to the peripheral circuit portion with an alignment precision rougher than the second minimum processing dimension. By stacking the peripheral circuit portion and the memory portion as separate layers in this way, a microprocessing method not needing high precision alignment and having a very small processing size can be employed for only the memory portion needing miniaturization for enlarging the capacity.

Fourth Embodiment

The perspective view of the memory device using a semiconductor etc. as a memory material according to the fourth embodiment is similar to FIG. 1 of the perspective view of a memory device according to the first embodiment.

The semiconductor substrate Sub is formed with a peripheral circuit portion. Over this via for example an insulating film, a memory portion including the word lines WL and the bit lines BL is stacked. The memory portion and the peripheral circuit portion are connected by word line contacts $CT_{WL}$, bit line contacts $CT_{BL}$, and other contact portions.

The peripheral circuit portion is formed on for example the silicon semiconductor substrate using lithography technology used for general semiconductor processes and using microprocessing technology having a first minimum processing dimension. For example, it comprises circuits including MOS transistors, resistors, and capacitors, and other devices and excluding the memory portion in the semiconductor memory device, that is, an address, block, or, in the case of multiple layers, layer selection circuit, signal detection use sense amplifier circuit, recording control circuit, and, in the case of a multi-value configuration, multi-value data extraction circuit and multi-value recording use closed loop recording control circuit. In accordance with need, it is further comprised of for example a data encoder, data decoder, error correction, boosting, or other circuit, CPU, input/output circuit, buffer memory, etc.

The above memory portion is configured by a plurality of memory cells arranged in a matrix form and is processed by the microprocessing technology used for usual semiconductor processes having for example the second minimum processing dimension, but is electrically connected to the peripheral circuits with an alignment precision rougher than the alignment precision usually envisioned from the size of the microprocessing.

Note that the "minimum processing dimension" means not the minimum unit of the isolated patterns, but ½ of the minimum processing cycle, i.e., a so-called line and space.

For example, when the second minimum processing dimension is 50 nm, a precision of about 30% or less of 50 nm, that is, an alignment precision of about 15 nm or less, is required for a usual semiconductor device or memory device.

Contrary to this, in the memory device of the present embodiment, such a high alignment precision is not required, therefore it becomes possible to easily obtain a very fine processing precision or use microprocessing technology which was not used due to the problem of alignment precision.

Figure 15:
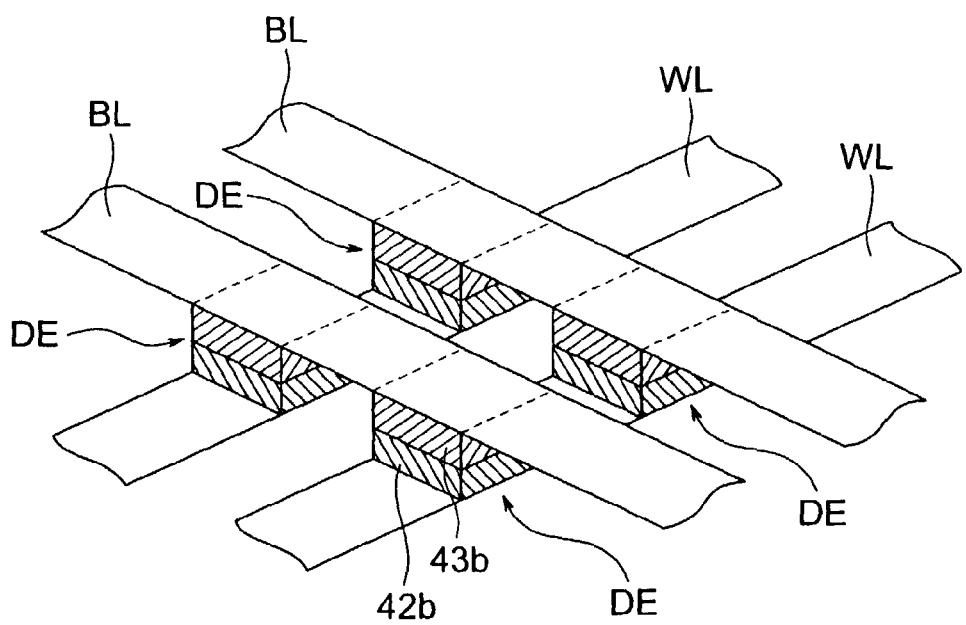
FIG. 15 is a schematic perspective view of memory cells in the memory portion of a memory device according to a fourth embodiment.

FIG. 15 is a schematic perspective view of memory cells in the memory portion. Four memory cells are shown in the figure. The regions where the bit lines BL and the word lines WL extending so as to intersect with each other intersect become the memory cells.

In each memory cell, a recording layer made of a recording material is provided between a word line WL and a bit line BL. Also, according to need, a selection switch layer (hereinafter also referred to as a "switch layer" or "switch device") made of a diode or nonlinear device is provided arranged in series with respect to the recording layer. Further, according to need, a barrier layer used so as not to prevent formation of unnecessary reaction products etc. can be provided too.

Both of the above recording layer and selection switch layer are made of 2-terminal devices having two terminals.

Figure 16:
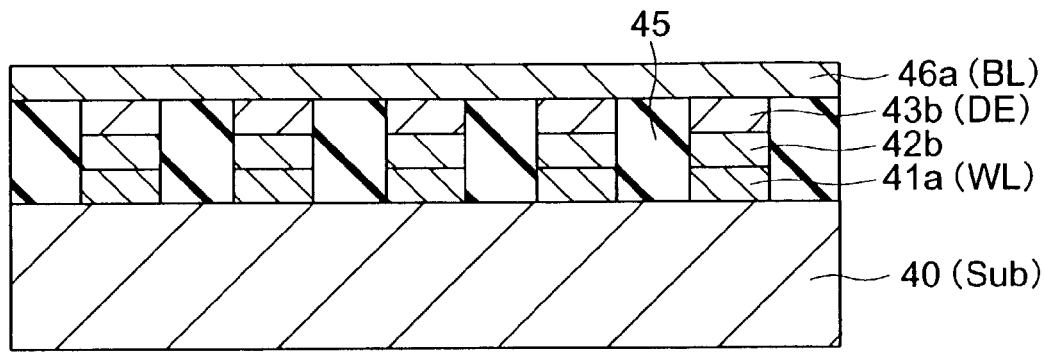
FIG. 16 is a sectional view along the extending direction of a bit line in the memory portion of a memory device according to the fourth embodiment.

FIG. 16 is a sectional view along the extending direction of the bit lines in the memory portion of a semiconductor memory device according to the present embodiment.

A semiconductor substrate 40 (Sub) is provided with a peripheral circuit portion (not illustrated). Over this via an insulating film, first interconnects 41a forming the word lines WL are formed.

In each memory cell region, the first interconnect 41a has stacked above it a recording layer 42b forming a 2-terminal device DE, for example, a resistance layer made of amorphous silicon, and a selection switch layer 43b made of for example a diode or nonlinear device. The regions other than the memory cells are buried by an inter-layer insulating film 45.

Further, above the selection switch layer 43b, second interconnects 46a forming the bit lines BL are formed.

It is also possible to employ a single recording layer structure made of a recording material not providing a selection switch layer between the first interconnects 41a and the second interconnects 46a. Alternatively, it is also possible to employ a multiple layer structure providing barrier layers according to need.

As the recording material constituting the recording layer 42b in each memory cell described above, use is made of a phase change material, a fuse material, or an anti-fuse material or other resistance change material changing in its resistance by applying a voltage or current pulse to the recording material.

The above memory cell is configured by a resistor and diode connected in series or a 2-terminal device made of a resistor. Data is recorded by the change of the value of the resistance due to the application of the voltage or current pulse, while data is reproduced by detecting the resistance value thereof.

As the recording material constituting the recording layer forming the resistor in each memory cell, use is made of a phase change material, fuse material, anti-fuse material, etc. The resistor is made by a thin film and is constituted by a material of a type referred to as a so-called fuse wherein all or part of the thin film of the memory cell is broken by the application of voltage or a current pulse or the resistance increases by the phase change or, conversely, a material of an anti-fuse type wherein the resistance value decreases due to the formation of a current path due to insulation breakage or phase change in all or part of the thin film of the memory cell by the application of voltage or a current pulse.

In application, the memory device can be classified into a programmable ROM capable of recording data only once and a RAM capable of repeated recording and erasing where the resistance reversibly changes according to the method of application of voltage or a current pulse.

As the phase change material, use is made of a chalcogenide semiconductor made of for example Ge, Si, Ag, In, Sn, Sb, Te, Se, As, Bi, etc. For example, a GeSbTe, AgInSbTe, or other composition can be used.

These materials have the characteristics of easy phase shift between the crystal and amorphous states according to a temperature change of the materials and a low resistance in the crystal state and a high one in the amorphous state in the storage and reproduction states.

In recording, a pulse current is passed to the desired cell to heat the recording material to a temperature of at least the crystallization temperature and not more than the melting point by the Joule heat caused by the resistance of the material per se or the Joule heat caused by the resistor connected in series to the phase changed material. Due to this, a crystallization state is obtained after the recording. By passing a pulse current shorter and larger than the current pulse causing the crystallization and heating the material to more than the melting point, then rapidly cooling, the amorphous state can be obtained after the recording.

Also, by appropriately selecting the recording conditions to form an intermediate state where part of the film in a memory cell is polycrystalline and the remainder is amorphous, it is possible to obtain an intermediate value of the resistance values obtained when the entire surface is polycrystalline or amorphous.

To prevent a reaction between the metal interconnect material and the chalcogenide material due to heating and movement of atoms between the two materials, it is also possible to form a barrier layer comprised of a nitride material or an oxide material.

As the recording material constituting the recording layer 42b, a so-called write-once type recording material capable of recording only once, for example, a fuse material and an anti-fuse material, may be used.

As a so-called fuse material increasing in resistance value by the application of voltage or a current pulse at the time of recording, for example, use is made of a polycrystalline silicon, nichrome, or other thin film resistor. Data is recorded by breakage of the resistor due to the Joule heat of the recording current.

In the usual fuse material, disconnection of the film by the recording results in the resistance ideally becoming infinitely large, but here a "fuse material" includes even a case where a very narrow region of the film of the memory cell undergoes insulation breakdown or part of the phase change film changes from the amorphous to polycrystalline state and thereby the resistance continuously increases.

Also, the anti-fuse material is made of for example amorphous silicon, a metal (semiconductor)/thin insulating film/metal (semiconductor) or other amorphous material or a metal thin film via an insulating material and can be lowered in resistance value by applying voltage or a current pulse.

In addition to a resistance change material per se, it is also possible to add a barrier layer for preventing damage due to a reaction with the metal interconnects or a resistor having a resistance not changing by recording as a bias of the resistance value in order to set a resistance value suited to recording and reading between the interconnect material and the resistance change material.

J. Non-Crystalline Solids, 137 & 138 (1991), pp. 1257–2562 discloses a resistance change memory device of a structure sandwiching a p+ amorphous hydrogenated silicon by for example chromium and various types of metals, for example, vanadium, tungsten, nickel, cobalt, silver, aluminum, chromium, manganese, and iron.

As the diode, it is also possible to use a so-called Schottky diode having a threshold voltage of about 0.5V or less or an MIM diode made of metal-insulating film-metal, but desirably use is made of a diode not using an interface phenomenon of different types of materials and made of a thin film having a thickness of 10 nm to 50 nm or a material having a nonlinear voltage-current characteristic. For example, use can be made of thin film devices made of many semiconductor materials having resistances decreasing along with a temperature rise, for example, Group VI semiconductor materials such as silicon and germanium, Groups II–VI semiconductors such as gallium arsenide, Group III–V ones such as gallium nitride, and semiconductors containing chalcogenide elements.

These may be in any of a single crystalline, polycrystalline, or amorphous state. Since they are semiconductors, the number of carriers generated increases by a temperature rise and therefore the resistance decreases. Also, it is possible to use any material so long as it is a material whose resistance is lowered by application of a voltage pulse or application of a current pulse even when not accompanied by a temperature rise.

For example, it is known that in a certain type of chalcogenide amorphous semiconductor such as an amorphous TeAsSiGeP thin film sandwiched by Mo electrodes reported in *Phys. Rev. Lett.* 21, (1968), p. 1450, by S. R. Ovshinsky, the resistance is abruptly lowered at a certain threshold voltage or more by the application of a voltage pulse. It is possible to use a material having such a characteristic.

Even in a case where a diode or nonlinear device as described above is not used, but just resistance is used, it is possible to reduce the interference between cells at the time or recording and reading by holding interconnects where a plurality of cells are arranged in an array at a predetermined potential.

The resistance of the recording material can be changed in value continuously or in several steps, i.e., so-called multi-value recording is possible.

By monitoring the recording state of the recording material, that is, the resistance value, at the time of recording and feeding it back to the recording circuit so as to record to obtain a predetermined resistance value in accordance with the data, high precision recording is achieved. Further, rather than at the same time as the recording, it is also possible to record data, then read it out once and repeat the recording until the predetermined resistance value is obtained in accordance with the signal level.

The recording material may be any of a material capable of recording only once and a material capable of repeated recording like a fuse or anti-fuse. The usual binary level recording or multi-value recording are possible.

Among these, in devices capable of recording only once and capable of multi-value recording, it is also possible to apply the so-called usual multi-value level recording for assigning all of the multi-value levels able to be recorded and read by one recording or possible to use such devices as memory devices assigning only one part of the multi-value levels among multi-value levels able to be recorded and read in one recording and assigning the remaining usable multi-value levels in the second and following recordings and thereby able to equivalently rewrite data even though the number of repeated recordings is limited.

Figure 17:
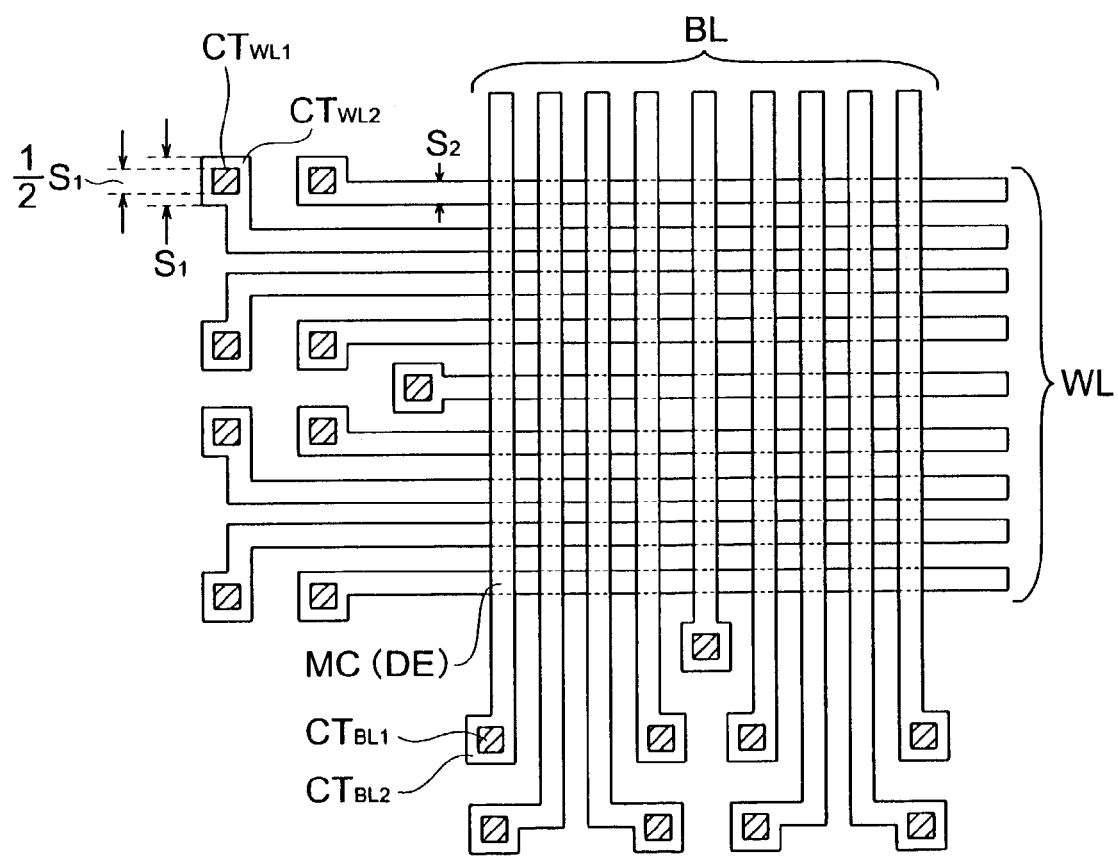
FIG. 17 is a plan view of the arrangement of the word lines and bit lines of the memory portion of a memory device according to the fourth embodiment and the contacts between these and the peripheral circuit portion.

FIG. 17 is a plan view of the arrangement of the word lines and bit lines of the memory portion of a memory device according to the present embodiment and the contacts between them and the peripheral circuit portion.

A plurality of word lines WL and bit lines BL extend in directions perpendicular to each other. 2-terminal devices DE are provided at the intersecting regions and constitute memory cells MC.

The peripheral circuit portion is formed with contacts for connection to the word lines WL (first word line contacts $CT_{WL1}$) and contacts for connection to the bit lines BL (first bit line contacts $CT_{BL1}$).

On the other hand, the word lines WL are provided with contacts (second word line contacts $CT_{WL2}$) through which they are connected to the first word line contacts $CT_{WL1}$ provided in the peripheral circuit portion.

The bit lines BL are provided with contacts (second bit line contacts $CT_{BL2}$) through which they are connected to the first bit line contacts $CT_{BL1}$ provided in the peripheral circuit portion.

In the above configuration, the word line contacts (contacts between first word line contacts $CT_{WL1}$ and the second word line contacts $CT_{WL2}$) are arranged in at least two columns in the direction in which the word lines WL extend.

Also, the bit line contacts (contacts between the first bit line contacts $CT_{BL1}$ and the second bit line contacts $CT_{BL2}$) are arranged in at least two columns in the direction in which the bit lines BL extend.

For this reason, the cycle of the word line contacts and the bit line contacts can be made larger than the cycle of arrangement of the word lines WL and the bit lines BL.

The first word line contacts $CT_{WL1}$ and the first bit line contacts $CT_{BL1}$ (hereinafter referred to as the first contacts $CT_1$) are squares having sides of ½$S_1$, the second word line contacts $CT_{WL2}$ and the second bit line contacts $CT_{BL2}$ (hereinafter referred to as the second contacts $CT_2$) are shaped as squares having sides of $S_1$, and the first contacts $CT_1$ and second contacts $CT_2$ are arranged in a cycle with adjacent first contacts $CT_1$ and second contacts $CT_2$ of $2S_1$ at the closest.

On the other hand, the width of the interconnects of the word lines WL and the bit lines BL of the memory portion is $S_2$. The cycle thereof is $2S_2$ at the shortest. Particularly, in FIG. 17, a case where $S_1=2\times S_2$ is illustrated.

The memory cells of the memory portion can be formed by self alignment with respect to the word lines WL and the bit lines BL, therefore it is not necessary to specify the absolute positions of the memory cells at the time of patterning. It is sufficient that memory cells be formed at the positions of the intersections of the word lines WL and the bit lines BL. For this reason, in the memory device of the present embodiment, when the memory portion is stacked on the peripheral circuit portion, it is sufficient that alignment precision be able to be secured with respect to the word line contacts and the bit line contacts having a larger cycle than the cycle of arrangement of the word lines WL and the bit lines BL. The memory portion can be stacked on the peripheral circuits by an alignment precision rougher than the alignment precision usually envisioned from the cycle of the memory portion interconnects.

Next, the method of production of a semiconductor memory device according to the present embodiment will be explained.

First, a CMOS process or other usual semiconductor process is used to form on a silicon semiconductor substrate the peripheral circuits other than the cell portions required for operating the memory, for example, an address selection circuit, signal detection circuit, data input and output circuit, recording pulse control circuit, and reproduction pulse control circuit.

Here, for example, the memory device is formed by a processing method having a high alignment precision by for example a process having a minimum processing line width F=0.18 to 0.25 μm using a KrF laser, a process of F=0.10 to 0.15 μm using an ArF laser, or a process of about 0.10 μm using an $F_2$ laser and further a process of 0.10 μm or less using a light source referred to as extreme UV light, an electron beam, X-ray, or the like.

Next, the silicon substrate on which the above peripheral circuit portion is formed is formed with a memory portion having fine memory cells. For the microprocessing when forming the memory portion, as mentioned above and as will be mentioned later, due to the configuration of the memory portion and the arrangement of the contacts between the memory portion and the peripheral circuit portion, a high alignment precision like that at the time of forming the above peripheral circuit portion is not necessary.

As the microprocessing technology when forming the above memory portion, LEEPL can be preferably used. Below, an explanation will be given of the case using LEEPL.

LEEPL, as disclosed in *Jpn. J. Appl. Phys.*, Vol. 38 (1999), Pt. 1, pp. 7046–7051, is a microprocessing method deposing a mask allowing an electron beam to pass therethrough in accordance with a pattern at a location close to the processed substrate and exposing a resist suitable for the electron beam by the low energy voltage electron beam passing through the mask.

As explained in the above document, processing of lines and spaces of about 50 nm is possible by considering the mask position etc. Further, lines and spaces of about 30 to 40 nm can be handled.

LEEPL is simpler in hardware configuration in comparison with other microprocessing technology such as EUV or EPL, so can reduce the capital costs. However, in comparison with the conventional photolithography or EUV etc., there was a problem of a low throughput.

This is derived from the fact that a mask formed by a thin membrane absorbs the unnecessary electron beams and thereby heats up and expands, whereby the mask distorts and the alignment precision and the pattern shape precision can no longer be held.

The same document reports that the throughput becomes 60 12-inch wafers per hour assuming allowing distortion of 10 nm with respect to a 1 cm×1 cm exposure area.

Contrary to this, in the microprocessing of the memory portion of the present embodiment, a relatively large alignment error or distortion error is permitted, therefore the throughput can be easily enhanced by raising the amount of irradiation of the electron beam.

For example, when assuming that relationships of the amount of irradiation of the electron beam, temperature rise, amount of distortion, etc. are all linear, when the amount of permissible distortion is 20 nm, it is possible to improve the throughput about two fold and, further, when the amount of permissible distortion is 30 nm, it is possible to improve the throughput about three fold.

Also the fact that not only the exposure time, but also the time required for the alignment of the wafer as a whole can be shortened contributes to the improvement of the throughput.

Accordingly, it becomes possible to use LEEPL having a relatively inexpensive capital cost to form high density memory cells with a high throughput.

Such a merit has a large effect particularly in a case of stacking recording memory cells in multiple layers.

Figure 18A:
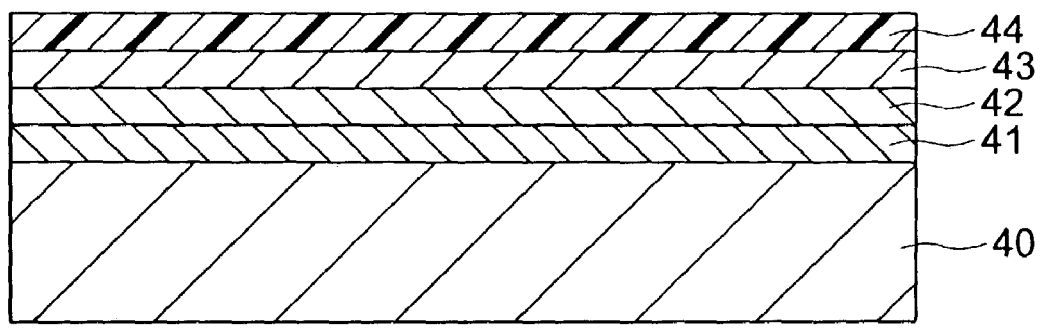
FIGS. 18A and 18B are sectional views of steps of a method of production of a memory device according to the fourth embodiment.

In the formation of the memory portion, first, a silicon semiconductor substrate 40 having the above peripheral circuit portion etc. formed thereon, as shown in FIG. 18A, has a conductive layer 41 for forming the first interconnects (word lines) deposited on it by for example sputtering.

As the material, the layer is formed by Al, Cu, Au, or Ag having a small resistance or a high melting metal excellent in electro-migration tolerance such as Mo, W, Ti, Cr, or Pt. For improving the reliability of the bonding etc., some additives can be mixed in too.

Next, for example CVD etc. is used to deposit amorphous silicon to form the recording layer 42. Further, it is used to deposit a material for forming diodes, nonlinear devices, etc. to form the selection switch layer 43.

Next, the selection switch layer 43 is coated with a resist film 44.

In the present embodiment, the selection switch layer is stacked over the recording layer, but the selection switch layer is not always necessary and need not be formed. Also, it is also possible to stack the barrier layer above and/or below the recording layer.

Figure 18B:
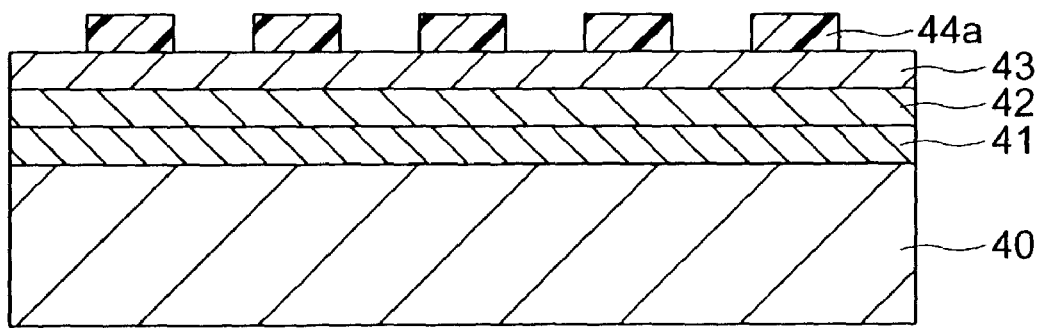

Next, as shown in FIG. 18B, for example LEEPL or other microprocessing technology is used for patterning to obtain a resist film 44a. The resist film 44a is the layer acting as the mask for patterning the lower selection switch layer 43, recording layer 42. and conductive layer 41 in the first interconnect (word line) direction.

Here, in the above microprocessing technology, high precision alignment such as that at the time of formation of the peripheral circuit portion described above is not required. The patterning can be performed with a relatively rough alignment precision. The above "high precision" designates a precision smaller than, for example about 20% to 30% of, the microprocessing line width of the memory cells.

Alternatively, conversely to the procedure of forming the film, then processing the resist above it, it is also possible to pattern the resist, then form the film and later remove the resist and the unnecessary film deposited above the resist, i.e., pattern the film by so-called lift-off.

Figure 19A:
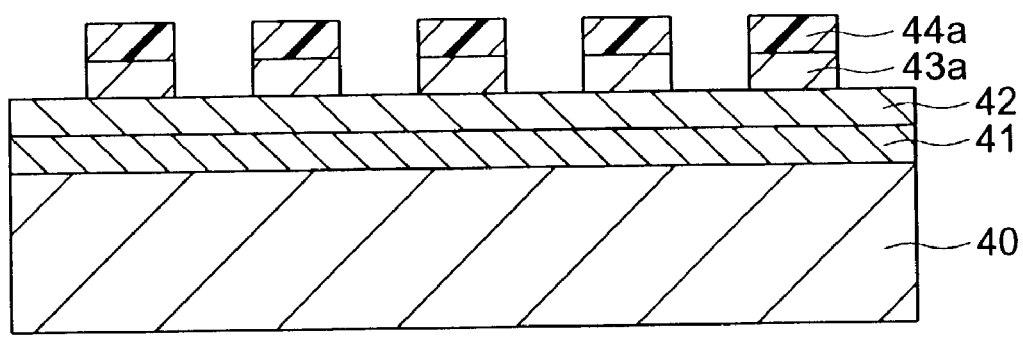
FIGS. 19A and 19B are sectional views of steps continuing from FIG. 18B.

Next, as shown in FIG. 19A, the resist film 44a is used as a mask to etch the selection switch layer 43 and form the selection switch layer 43a processed to the pattern of the resist film.

Figure 19B:
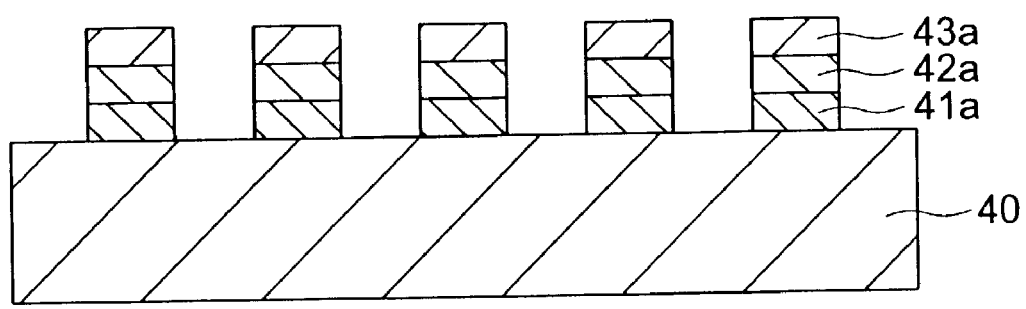

Next, as shown in FIG. 19B, the resist film 44a is used as a mask to etch the recording layer 42 and the conductive layer 41 to form a recording layer 42a and first interconnects 41a (word lines WL) processed to the pattern of the resist film.

Next, the resist film 44a is removed.

Figure 20A:
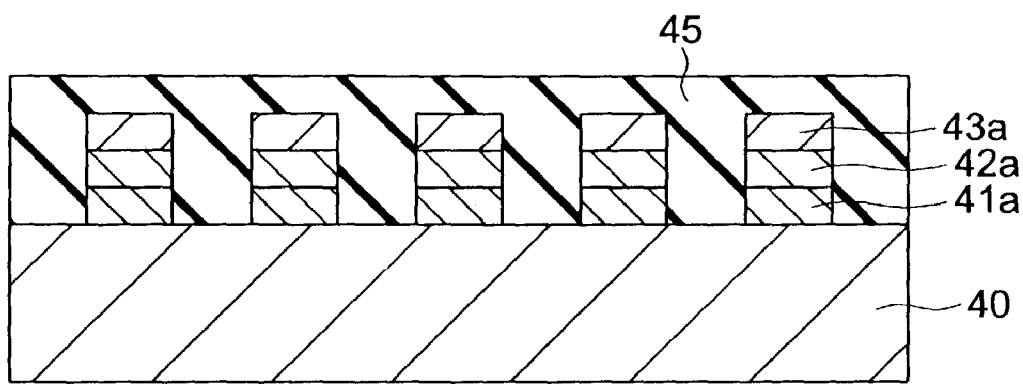
FIGS. 20A and 20B are sectional views of steps continuing from FIG. 19B.

Then, as shown in FIG. 20A, an organic insulating material or SOG is coated by for example spin coating and cured or $SiO_2$, SiOF, or another so-called "low-k" material is uniformly deposited by CVD or the like to bury the spaces among the processed first interconnects 41a, recording layer 42a, and selection switch layer 43a and thereby to form the inter-layer insulating film 45.

Figure 20B:
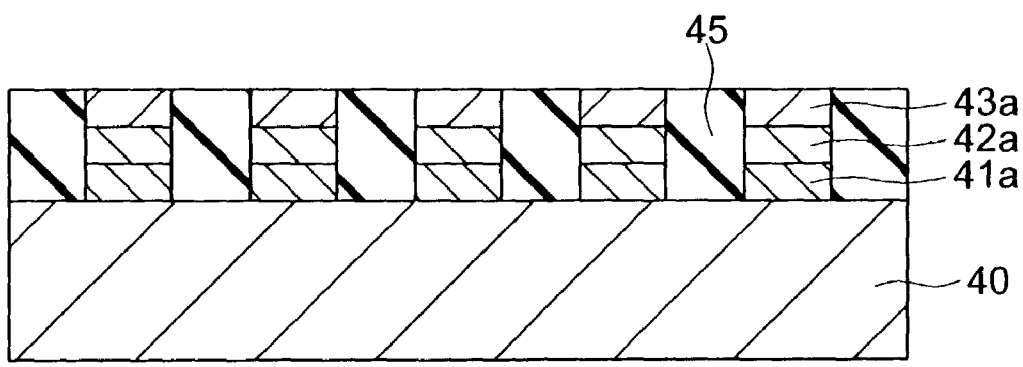

Next, as shown in FIG. 20B, for example CMP is used to remove and smooth the inter-layer insulating film 45 until the surface of the selection switch layer 43a (recording layer 42a in the case where the selection switch layer 43a is not provided) is exposed.

Figure 21A:
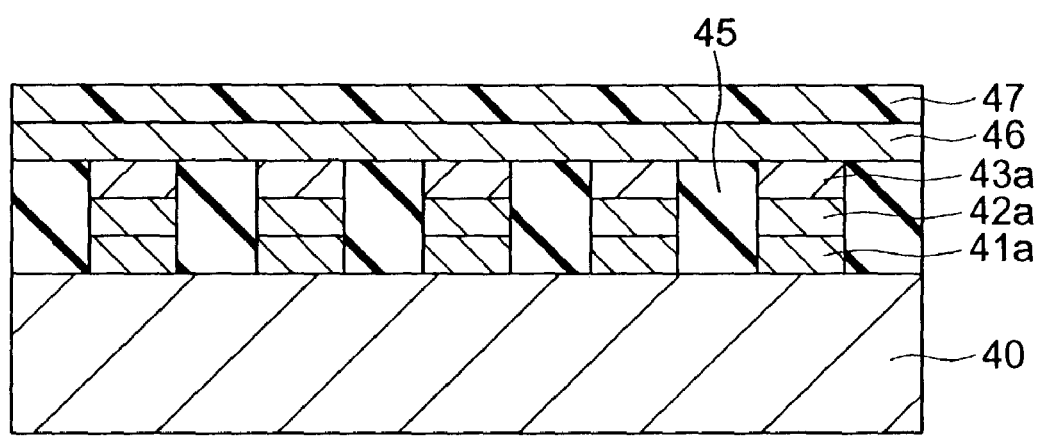
FIGS. 21A and 21B are sectional views of steps continuing from FIG. 20B.
Figure 21B:
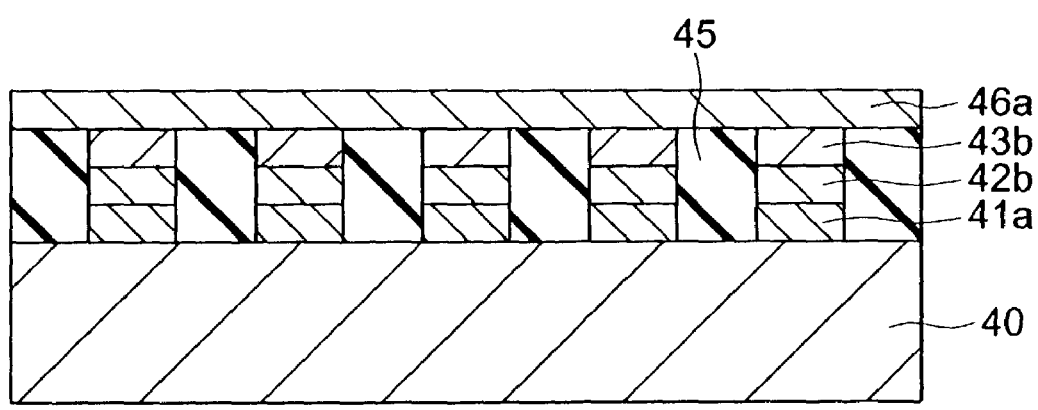

Next, as shown in FIG. 21A, for example sputtering etc. is used to deposit the conductive layer 46 forming the second interconnects (bit lines). As the material, various types of metal material can be used in the same way as those used for the first interconnects (word lines).

Next, in the same way as that described above, LEEPL or another microprocessing technology is used for patterning to obtain a resist film 47. The resist film 47 is the layer forming the mask for patterning the lower conductive layer 46, selection switch layer 43a, and recording layer 42a in the direction of the second interconnects (bit lines) perpendicular to the first interconnects (word lines).

Here, in the above microprocessing technology, in the same way as above, high precision alignment such as when forming the above peripheral circuit portion is unnecessary. The above "high precision" designates a precision smaller than, for example about 20% to 30% of, the microprocessing line width of the memory cells.

Next, the resist film is used as the mask for RIE or other etching to successively process the conductive layer 46, selection switch layer 43a, and recording layer 42a to obtain the patterned second interconnects 46a (bit lines), switch selection layer 43b, and recording layer 42b.

Thereafter, the resist film is removed and the spaces between memory cells caused due to the patterning are buried by an insulating material to thereby enable the production of the memory portion of a memory device according to the present embodiment.

Next, the reason why a high alignment precision like that at the time of formation of the peripheral circuit portion becomes unnecessary when microprocessing the memory portion by LEEPL or the like in the above method of production of a memory device will be explained.

Figure 22A:
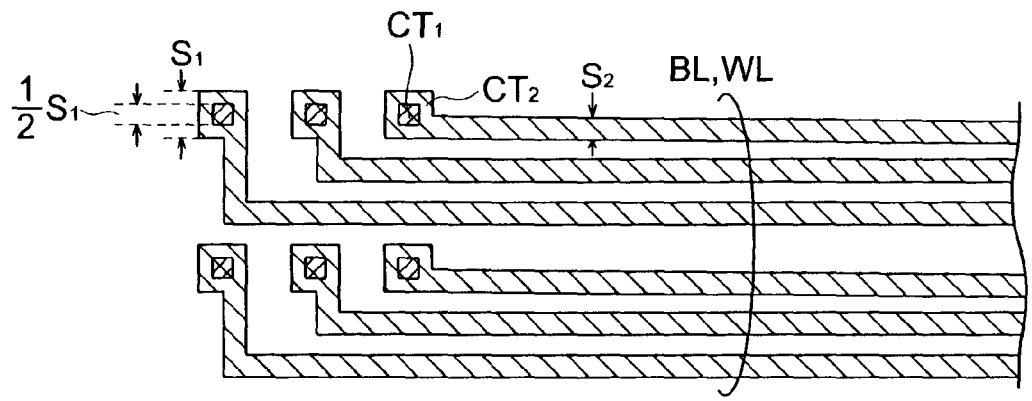
FIGS. 22A to 22C are plan views of arrangements of first contacts for connection to the word lines or bit lines provided in the peripheral circuit portion and second contacts for connection to the word lines or bit lines.
Figure 22B:
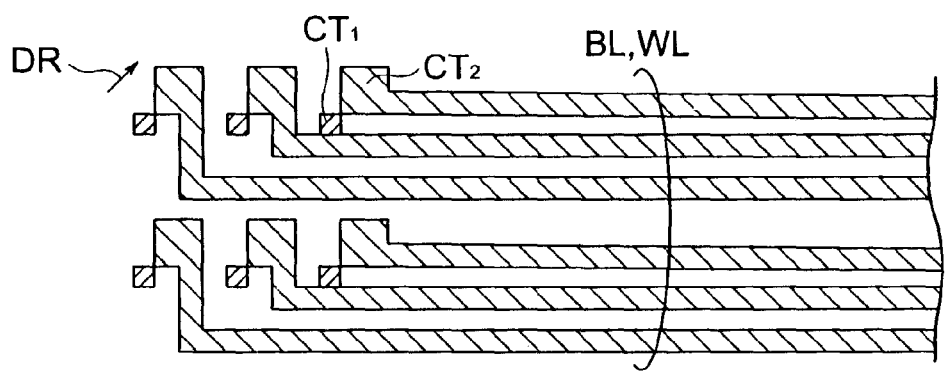
Figure 22C:
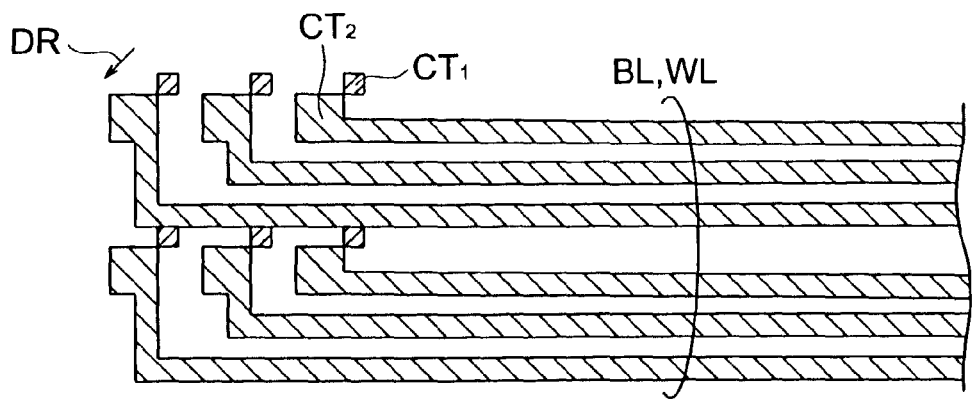

FIGS. 22A to 22C are plan views of the arrangement of the first contacts $CT_1$ for connection to the word lines WL or bit lines BL provided in the peripheral circuit portion and the second contacts $CT_2$ for connection to the word lines WL or bit lines BL.

FIG. 22A shows a case where there is no alignment error in the first contacts $CT_1$ and the second contacts $CT_2$; FIG. 22B shows a case where the alignment of patterns of the word lines WL or bit lines BL and second contacts $CT_2$ with respect to the first contacts $CT_1$ formed in advance is deviated up to the contact limit in a direction DR (top right direction in the figure); and FIG. 22C shows a case where the alignment of patterns of the word lines WL or bit lines BL and second contacts $CT_2$ with respect to the first contacts $CT_1$ formed in advance is deviated up to the contact limit in the direction DR (bottom left direction in the figure).

In actuality, because of the problem of contact resistance and the problem of fluctuation in processing precision or insulating film pressure tolerance etc., a certain margin is necessary in the minimum size of the first contacts $CT_1$, the distance to adjacent first contacts $CT_1$, the distance to the memory portion interconnect connected to a first contact $CT_1$ adjoining a first contact $CT_1$, etc. Here, however, an ideal case where the first contacts $CT_1$ and the second contacts $CT_2$ need only contact each other slightly and a distance of 0 or more need only be provided where insulation is necessary is assumed.

In FIGS. 22B and 22C, when shifting by the same amounts up, down, left, and right, limits of contact of the first contacts $CT_1$ and the second contacts $CT_2$ occur. The amount thereof is $1.5 \times S_2$.

Accordingly, the maximum alignment error in the formation of contacts in for example a case where $S_1=100$ nm and $S_2=50$ nm becomes 75 nm. This is a value rougher than the alignment precision generally required when microprocessing by lines and spaces of for example 50 nm (15 nm in the case of 30%).

However, when the contact resistances at the contact portions desirably should be made constant, that is, when the contact areas of the first contacts $CT_1$ and the second contacts $CT_2$ desirably should be made constant, the permissible amount of alignment error becomes 25 nm. In this case as well, the value is rougher than the generally required alignment precision.

Further, in FIG. 22A, the cycle of the word lines WL or bit lines BL is not constant. The space between the word line WL or bit line BL connected to the contact portion located at the rightmost side of three contact portions arranged aligned in the horizontal direction and the word line WL or bit line BL adjacent in the upward direction is larger than the other spaces.

Along with this, the recording density falls somewhat. By further increasing the number of the contact portions arranged aligned in the horizontal direction from three or by providing one contact portion and a word line WL or bit line BL in the above larger space as shown in FIG. 17, the drop in the recording density can be suppressed.

Figure 23A:
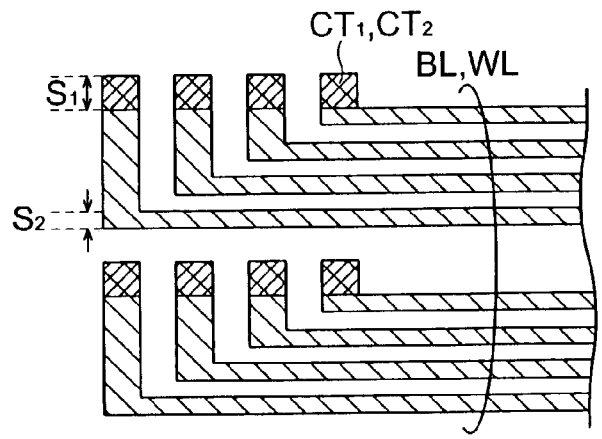
FIGS. 23A to 23C are plan views of arrangements of first contacts for connection to the word lines or bit lines provided in the peripheral circuit portion and second contacts for connection to the word lines or bit lines.
Figure 23B:
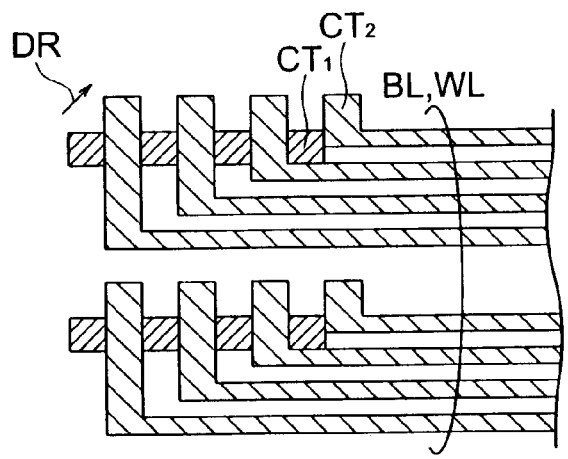
Figure 23C:
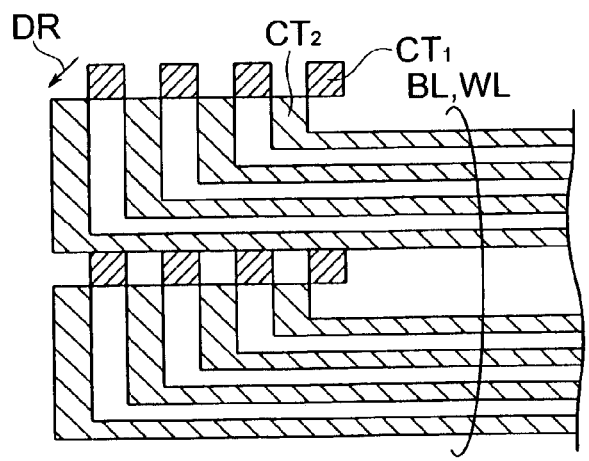

FIGS. 23A to 23C are plan views of arrangements of the first contacts $CT_1$ for connection to the word lines WL or bit lines BL provided in the peripheral circuit portion and the second contacts $CT_2$ for connection to the word lines WL or bit lines BL. Both of the first contacts $CT_1$ and the second contacts $CT_2$ form square shapes having sides of $S_1$. The width of the interconnects of the word lines WL and bit lines BL is $S_2$.

FIG. 23A shows a case where there is no alignment error in the first contacts $CT_1$ and the second contacts $CT_2$; FIG. 23B shows a case where the alignment of patterns of the word lines WL or bit lines BL and second contacts $CT_2$ with respect to the first contacts $CT_1$ formed in advance is deviated up to the contact limit in the direction DR (top right direction in the figure); and FIG. 23C shows a case where the alignment of patterns of the word lines WL or bit lines BL and second contacts $CT_2$ with respect to the first contacts $CT_1$ formed in advance is deviated up to the contact limit in the direction DR (bottom left direction in the figure).

In FIGS. 23B and 23C, when shifting by the same amounts up, down, left, and right, limits of contact of the first contacts $CT_1$ and the second contacts $CT_2$ occur. The amount thereof is $2\times S_2$.

Accordingly, the maximum alignment error in the formation of contacts in for example a case where $S_1$=100 nm and $S_2$=50 nm becomes 100 nm. This is a value rougher than the alignment precision generally required when microprocessing by lines and spaces of for example 50 nm (15 nm in the case of 30%).

In the case of FIG. 23A as well, the space between the word line WL or bit line BL connected to the contact portion located at the rightmost side of three contact portions arranged aligned in the horizontal direction and the word line WL or bit line BL adjacent in the upward direction is larger than the other spaces.

Figure 24:
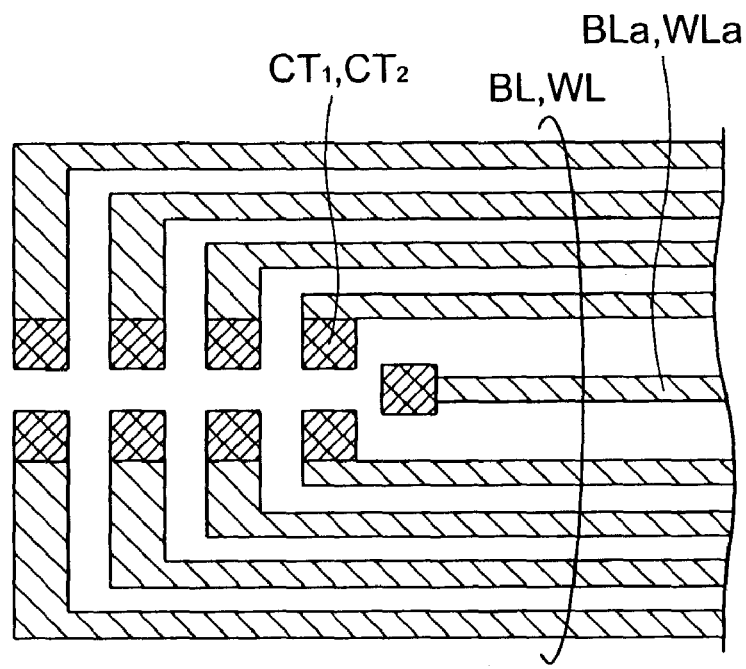
FIG. 24 is a view of a layout further providing the contact portions and word lines or bit lines between broadened spaces of patterns shown in FIGS. 23A to 23C.

FIG. 24 shows a layout wherein one contact portion and a word line WLa or bit line BLa are further provided in the above larger space. By employing this pattern, the drop in the recording density can be suppressed.

Figure 25:
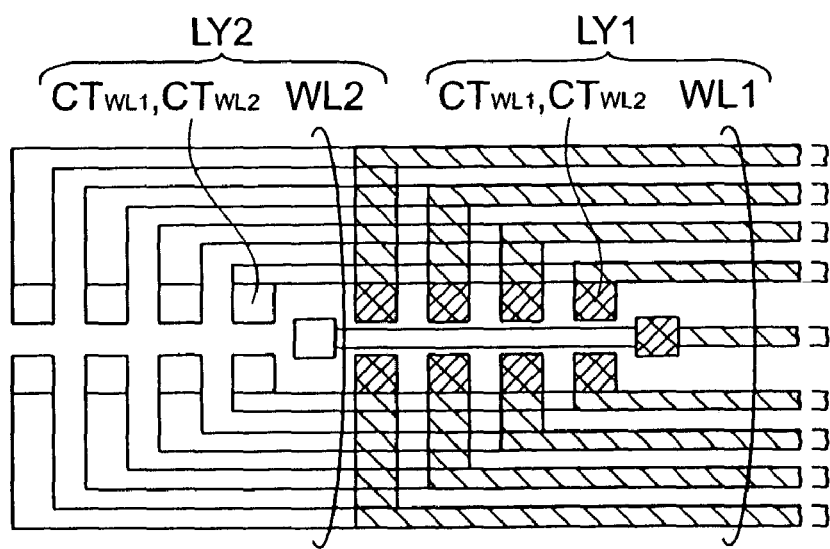
FIG. 25 is a view of a layout in a case where word lines having the pattern shown in FIG. 24 are stacked in two layers.

FIG. 25 shows a layout where word lines WL of the pattern shown in FIG. 24 are stacked in two layers.

Namely, as a first memory layer LY1, not illustrated bit lines are stacked above the word lines WL1, and a recording layer having the recording material is provided between the word lines and the bit lines. The memory cells are configured by this. The word lines WL1 have second word line contacts $CT_{WL2}$ connected to them and are connected to first word line contacts $CT_{WL1}$ to be connected to the peripheral circuit portion.

On the other hand, as a second memory layer LY2, word lines WL2 are stacked above the bit lines, and a recording layer having the recording material is provided between the bit lines and the word lines. The memory cells are configured by this. The word lines WL2 have second word line contacts $CT_{WL2}$ connected to them are connected to the first word line contacts $CT_{WL1}$ to be connected to the peripheral circuit portion.

The configuration shown in FIG. 25 is one where one set of bit lines is shared by two sets of word lines.

Two sets of word lines WL1 and WL2 must contact the peripheral circuit portion, so when stacking them as described above, the contacts are offset so that they do not overlap.

In the layouts shown in FIG. 17, FIG. 22A, and further FIG. 23A, FIG. 24, and FIG. 25 mentioned above, the case where the contact portions corresponding to the adjacent interconnects in the memory portion were arranged adjacent at the end portion on the same side in the direction of extension of the interconnects was explained, but the arrangement of the contact portions is not limited to this.

For example, it is also possible to obtain the equivalent effect by having two contact portions corresponding to two adjacent interconnects extending in one direction in the memory portion be arranged at one end portion in the direction of extension of the interconnects and at the other end portion in the direction of extension of the interconnects.

Next, a specific example of the method of production of a memory device according to the present embodiment will be explained.

A p-type silicon wafer having a thermal oxide film formed on its surface was formed over its entire surface with a chromium thin film having a thickness of 100 nm by sputtering.

The surface was then coated with a positive type photoresist having a thickness of 1 $\mu$m, then irradiated with i-rays of a mercury lamp through a mask at portions corresponding to the memory cell portions to develop the photoresist.

In this state, a vacuum annealing device of 270° C. was used to cure the photoresist. The resist material was used as an insulating material.

Next, an amorphous silicon film having a thickness of 100 nm was formed by RF sputtering, a tungsten film having a thickness of 100 nm was continuously formed by sputtering, then a photoresist was coated, exposed, and developed to thereby to form a resist pattern determining the patterning shapes of the amorphous silicon and tungsten.

Using this pattern as a mask, RIE was used to etch the tungsten and amorphous silicon, then the unnecessary resist was removed to thereby form a sample for measurement.

When the area of contact between the chromium film and the amorphous silicon was 4×9 $\mu$m, the resistance value after forming the sample was 9 M$\Omega$, and the resistivity was $5\times10^7$ $\Omega$·cm.

By adding small amounts of oxygen and aluminum into the amorphous silicon, the resistivity was increased and could be continuously changed in accordance with the amount of impurity added up to $5\times10^8$ $\Omega$·cm as a measurable range. If there were no constraints from the measurement device, it would have been possible to continuously control the resistivity of the film up to the resistivity of the amorphous $SiO_2$, that is, the insulator.

Also, conversely, when adding small amounts of antimony or aluminum, titanium, chromium, platinum, or other metals in more than certain amounts, the resistivity was decreased and could be easily continuously changed to $1\times10$ $\Omega$·cm or less.

Further, it was also possible to lower the resistivity to the resistivity of the amorphous metal, that is, about $1\times10^{-4}$ $\Omega$·cm, by increasing the amount of metal added.

The ability to be continuously changed in resistivity over a wide range in this way is a phenomenon peculiar to an amorphous semiconductor. A similar effect could also be obtained in silicon and, in addition, germanium, a chalcogenide semiconductor, and further a transition metal oxide such as vanadium oxide, tungsten oxide, chromium oxide, and titanium oxide.

Even with an amorphous film formed by CVD, plating process, vapor deposition, or the like in addition to sputtering, without much regard as to the production process, it is possible to control the resistance over wide range from a metallic property to an insulation property by the composition, material, and film formation conditions.

Figure 26:
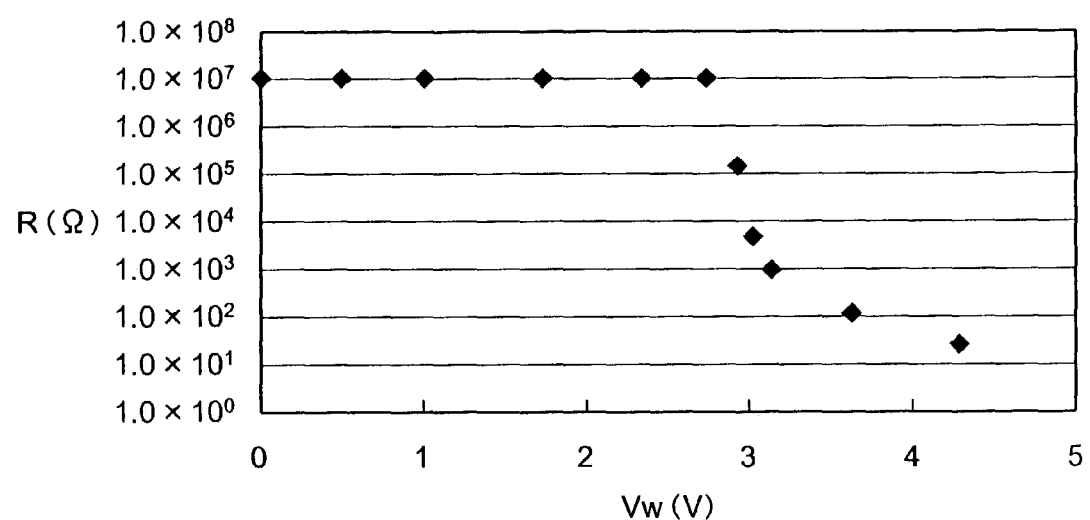
FIG. 26 is a view of the change of a resistance value with respect to an applied voltage when applying a voltage pulse having a pulse width of 150 ns to a chromium layer and a tungsten layer of a memory cell comprised of a chromium film/amorphous silicon film/tungsten film.

FIG. 26 is a view of the change of the resistance value R with respect to an applied voltage $V_W$ when applying a voltage pulse having a pulse width of 150 ns to the chromium film and the tungsten film of a memory cell constituted by a chromium film/amorphous silicon film/tungsten film.

When the voltage is 2.7V or less, there is no change before and after the recording, but when the voltage is 2.9V or more, the resistance abruptly decreases and becomes 5 kΩ when the voltage is 3V. From there, the resistance slightly gently decreases with respect to a further increase of the voltage and falls to 30Ω. When used as a PROM for recording only one time, it is possible to set the resistance to any value in a range from 3 MΩ to 40Ω according to the recording voltage. Also, by applying a small voltage having the same polarity and a narrow pulse width from a state where the resistance value becomes about 1 kΩ under the same recording conditions, the resistance value increased.

Figure 27:
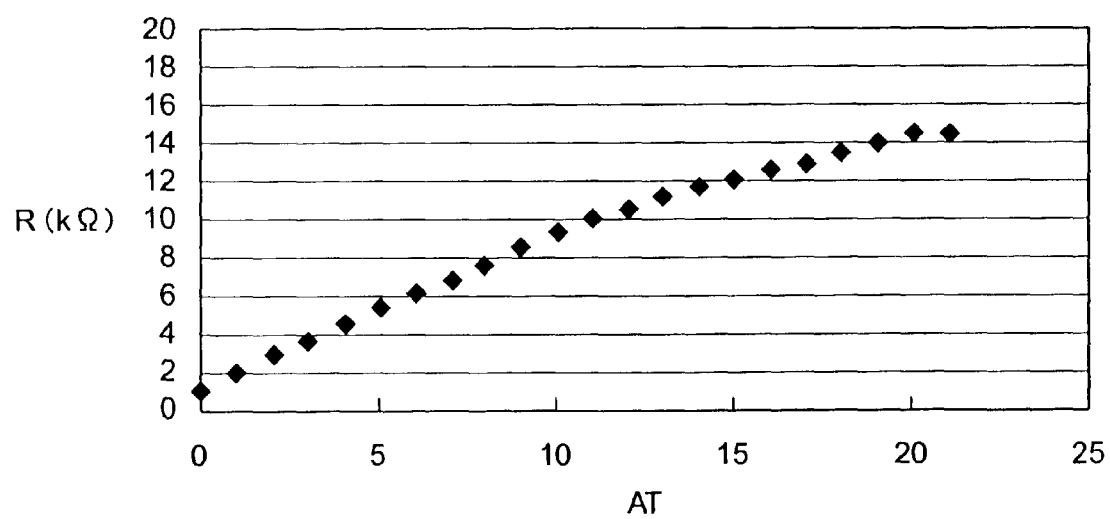
FIG. 27 is a view of the change of a resistance value with respect to a number of times of application of a pulse voltage in a case of repeatedly applying a pulse having a pulse width of 20 nm and a voltage of 1V.

FIG. 27 is a view of the change of the resistance value R with respect to the number of times of application of a pulse voltage AT in a case of setting the resistance value to 1 kΩ by the application of voltage described above shown in FIG. 26, then repeatedly applying a pulse having a pulse width of 20 nm and a voltage of 1V in the above memory cell constituted by a chromium film/amorphous silicon film/tungsten film.

The resistance value could be continuously changed from an initial value 1 kΩ up to 14 kΩ by application of 20 pulses. Accordingly, multi-value recording becomes possible even by the number of times of application of pulses.

As shown in FIG. 26 and FIG. 27, in the above memory cell constituted by a chromium film/amorphous silicon film/tungsten film, the resistance value could be reversibly changed by the application of a voltage pulse.

Further, it is possible to similarly change the resistance even in an amorphous silicon film into which an impurity was added. In this case, as the range of the resistance, when adding a small amount of aluminum, the resistance could be changed from 30 MΩ as the initial value to 40Ω. Further, when increasing the aluminum, the resistance could be changed in a range of from 100 kΩ to 10Ω.

Next, the method of recording and reproduction of data in the memory device according to the present embodiment will be explained.

Figure 28:
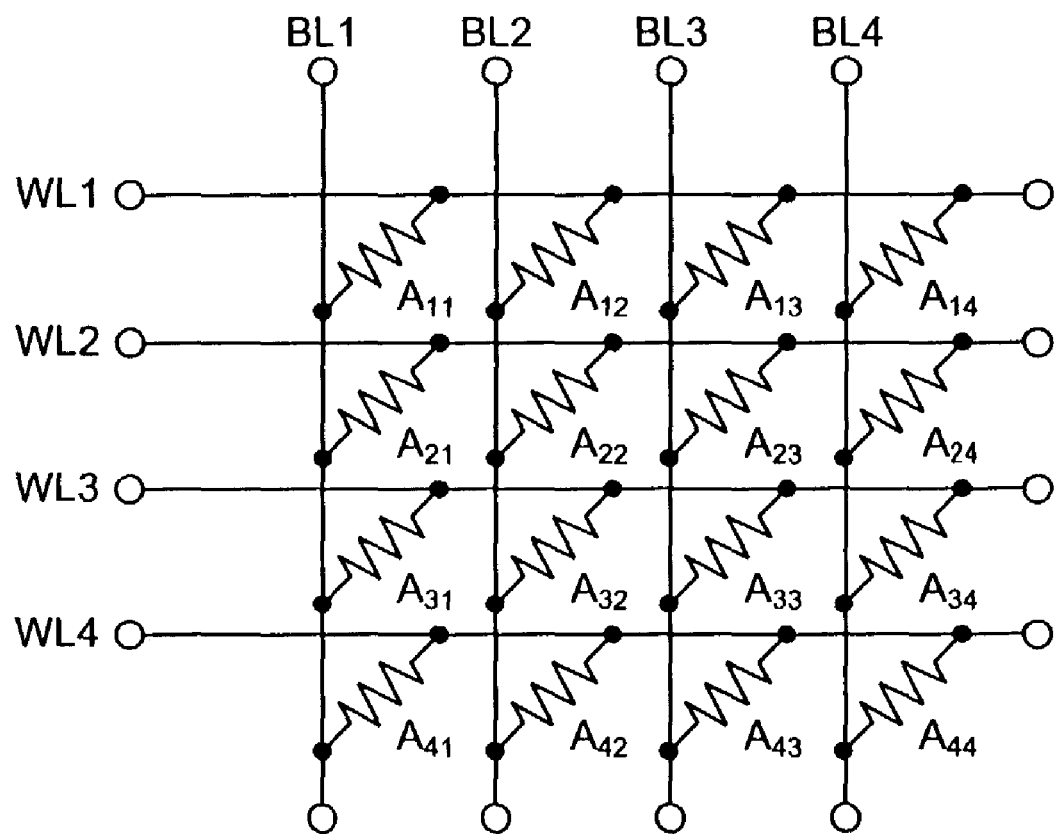
FIG. 28 is an equivalent electrical circuit diagram of a memory cell array in the memory portion of a memory device according to the fourth embodiment.

FIG. 28 is an equivalent electrical circuit diagram of a memory cell array in the memory portion of a memory device according to the present embodiment.

Here, a case where the array is configured by 4×4 memory cells, and each memory cell is configured by a single resistance change device of the recording layer is shown.

Unlike the conventional case using MOS transistors for the memory cells, in order to suppress the interference between memory cells at the time of the recording or reading, it is necessary to control the potential of for example each memory cell and interconnect at the time of the recording or the time of the reading.

As shown in FIG. 28, memory cells $A_{xy}$ (x, y=1, 2, 3, 4) are arranged in a 4×4 matrix in regions where the four word lines (WL1 to WL4) and four bit lines (BL1 to BL4) intersect.

The initial value of the resistance of each memory cell is $R_i$ (Ω), and resistances after the recording are $R_i$ (Ω) and $R_W$ (Ω) ($R_i > R_W$) in accordance with the data.

Note that, for simplification, $R_W$ is assumed to be the same in all cells.

First, assume a case of recording data in only the memory cell $A_{11}$.

In this case, $V_W$ is applied to the word line WL1, BL1 is brought to the ground level, that is, grounded to 0V, and $V_W/2$ is applied to the remaining word lines and bit lines.

By such a voltage setting, $V_W$ is applied to only $A_{11}$, a voltage of $V_W/2$ is applied to cells of $A_{x1}$ (x=2, 3, 4) and $A_{1y}$ (y=2, 3, 4), and no voltage is applied to the remaining cells.

Here, $V_W$ is the voltage necessary for recording. Further, by using for the memory cells a material not undergoing any change in resistance by application of the voltage $V_W/2$, for example, a material having a characteristic shown in FIG. 26, data is recorded only in the memory cell $A_{11}$.

The power consumption in this case is $V_W^2/R_{11} + \Sigma V_W^2/4R_{xy}$ (x=2, 3, 4, y=1) and (x=1, y=2, 3, 4). The power unnecessarily consumed for the recording of unselected cells is represented by the second term. $R_{xy}$ indicates the mean resistance value during the recording of the memory cell $A_{xy}$.

Subsequently, even when recording data in other cells, similarly the above potential is given to the word line and the bit line corresponding to the cell $A_{xy}$ to be recorded in.

Next, assume a case of simultaneously recording data in a plurality of cells.

For example, when recording data in the memory cells $A_{11}, A_{12}, A_{13}$, and $A_{14}$ connected to the word line WL1, $V_W$ is applied to the word line WL1 and the potential of the other word lines is set to 0V. In accordance with the data to be recorded in the memory cell $A_{1y}$ (y=1, 2, 3, 4), 0V or $V_W/2$ is applied to the bit line BLy (y=1, 2, 3, 4).

In a memory cell where 0V is applied to the bit line, $V_W$ is applied to the memory cell, so data is recorded.

Also, a voltage of only $V_W/2$ is applied to a memory cell where $V_W/2$ is applied to the bit line, so data is not recorded.

Also, a voltage of only $V_W/2$ at the maximum is applied to memory cells connected to word lines other than the word line WL1, so similarly data is not recorded.

The power consumption in this case is $4V_W^2/R_{1y}$ (y=1, 2, 3, 4) when recording data in all memory cells, that is, when the potentials of all BLy (y=1, 2, 3, 4) are 0V. The power consumed in unselected memory cells is 0.

On the other hand, the power consumed when $V_W/2$ is applied to all bit lines becomes $\Sigma V_W^2/4R_{xy}$ (x=1, 2, 3, 4; y=1, 2, 3, 4), and the unrequired power consumption in the unselected memory cells becomes $\Sigma V_W^2/4R_{xy}$ (x=2, 3, 4; y=1, 2, 3, 4). The mean power consumption in unnecessary memory cells where binary recording data of "0" and "1" are uniformly dispersed becomes $\frac{1}{2}\Sigma V_W^2/4R_{xy}$ (x=2, 3, 4; y=1, 2, 3, 4). In this case, as described above, the power consumption becomes the power consumption in the unnecessary memory cells the same as the case when successively recording data in a single memory cell.

Assume that $R_i$=200 kΩ and $R_W$=160 kΩ and set the resistance at the time of recording to a constant $R_{xy}$=180 kΩ regardless of the data and set $V_W$=1V and the array size to 10×10. In this case, the maximum power consumption becomes 10×10×1/4/160 k=0.15 mW, and the minimum power consumption becomes 0.06 mW.

Further, if setting the array size to 100×100, the power consumptions become 15 mW and 6 mW.

Further, if setting the time of application of a voltage pulse at the time of recording to 150 ns, when the array size is 100×100, a recording transfer rate of 100 bit/150 ns, that is, 660 Mbps, is achieved.

The power consumption can be suppressed by slowing the recording transfer rate. For example, by applying the voltage pulse for a period of 150 ns, then ceasing application of the voltage pulse for a period of 150 ns, both of the power consumption and transfer rate are halved. Also, by not simultaneously recording data in all memory cells connected to the same word line, but recording data in only half of the memory cells and making the potentials of the word lines and bit lines corresponding to the unselected memory cells $V_W/2$, the power consumption and transfer rate decrease.

In order to lower the power consumption without sacrificing the transfer rate, for example, usage of a recording material responding even if the voltage pulse is applied for a short period or a reduction of the voltage or current or raising of the resistance are effective.

Also, when the array is comprised of a further larger 1000×1000 cells, the simple power consumption becomes 1.5W at the maximum and 600 mW at the minimum, so it is necessary to use the method of suppression of power consumption mentioned above.

As another method of suppression of power consumption, it is effective to use a switch device. A MOS transistor or pn junction diode or other device able to give a very high current ON-OFF ratio can suppress the power consumption considerably low, but such devices ate difficult to microprocess, so are hard to use.

In place of this, use of a switch device made of a chalcogenide semiconductor or a nonlinear device utilizing the temperature characteristic of the resistance of a semiconductor is convenient since the microprocessing is easy.

The former is the thin amorphous TeAsSiGeP film sandwiched by Mo electrodes or the like reported in for example *Phys. Rev. Lett.* 21, (1968), p. 1450 by S. R. Ovshinsky. The above device has the characteristic of being extremely high in resistance when the voltage applied to the device is lower than a certain threshold value and of decreasing in resistance when a voltage of the threshold value or more is applied. The ON-OFF ratio of the current can be easily made one of 3 digits or more. Further, if turning the current ON, then cutting the applied voltage, the original high resistance state is returned to, so the device can repeatedly operate.

The threshold voltage and resistance value of the switch device can be appropriately selected by changing the composition or thickness in a wide range since the switch device is an amorphous film.

For example, in terms of the thickness, the lower limit of thickness where the amorphous state is exhibited is about 5 nm or more. Use is possible in that range.

These films can be easily deposited by sputtering. Since the operation principle is not the interface phenomenon sensitive to the interface between different types of materials and since a uniform characteristic is obtained over a wide range of area in the amorphous state, the switch device is preferred for the present invention.

Further, even if a large ON-OFF ratio of the current cannot be obtained, for example, even if the ratio is 2, the power consumption can be lowered, so the effect is large.

As seen from the voltage setting at the time of the recording operation described above, when the voltage $V_W/2$ is applied to the unselected memory cells. On the other hand, when data is recorded in a selected memory cell, the voltage $V_W$ is applied. In such a case, the resistance of the memory cell nonlinearly responds to the applied voltage, that is, the resistance is high when the voltage $V_W/2$ is applied and becomes low when the voltage $V_W$ is applied. By this, the power consumption in the unrequited unselected cells can be reduced.

General semiconductor materials have the characteristic of a decrease in the resistance along with a temperature rise.

Accordingly, when a resistance is formed by a semiconductor, the phenomenon arises that the temperature rises due to the Joule heat resulting from current flowing there and the resistance becomes low.

For example, with TaGeSbS, which is one type of an amorphous chalcogenide semiconductor, a temperature rise from 0° C. to 28° C. causes the resistance to fall to 1/10. When this material is used for part of a selected memory cell, if the resistance value of the switch device is $R_{SW}$ and the resistance value of the recording layer stacked on this switch device is $R_{RC}$, the total resistance value is represented by $R_{SW}+R_{RC}$, and the voltage applied to the recording layer at the time of recording is proportional to $R_{RC}V_W/(R_{SW}+R_{RC})$, and the power consumption in the unselected cells is proportional to $V_W^2/(R_{SW}+R_{RC})$. Here, since the voltage $V_W$ is applied to the selected cell to be recorded in, while $V_W/2$ is applied to the unselected cells, the applied voltage or the current pulse is larger in the selected cell, therefore $R_{SW}$ has a larger value in the unselected cells in comparison with the value of the selected cell. Accordingly, in comparison with the case where $R_{SW}$ is constant without regard as to the selected cell and unselected cells, the voltage to be applied for recording data at the selected cell is relatively small, and it becomes possible to make the power consumption in the unselected cells relatively small.

When thermal diffusion can be ignored for an extremely short time, since the Joule heat and the temperature rise are not proportional, if the temperature rise of the selected memory cell is 28° C., the temperature rise in the unselected memory cells becomes 7° C. The difference thereof is about 20° C. Since a value of several orders or more can be secured as the difference of resistances, it becomes possible to lower the power consumption.

Such behavior is a phenomenon occurring in all semiconductor materials. For example, silicon, germanium, silicon germanium, Group III–V compound semiconductors, Group II–VI compound semiconductors, transition metal oxide semiconductors, chalcogenide semiconductors, etc. can be used regardless of whether crystalline or amorphous in phase.

The recording material changing in resistance can also be constituted by a semiconductor material, so it is also possible to form a nonlinear device used for suppressing the power consumption as described above by a recording material.

In this case, the memory cell is constituted by a single thin film. This is convenient for mass production.

On the other hand, when providing the nonlinear device separately from the recording layer made of a recording material, they are connected in series between a word line and bit line to form a memory cell. When the recording material uses insulation breakdown as the recording mechanism or in the case of a semiconductor having a high concentration of metal added, the change of the resistance along with temperature is relatively small.

In such a case, by adding the semiconductor nonlinear device as described above, it becomes possible to reduce the power consumption.

In the above explanation, the case where binary data was digitally recorded was explained, but by selecting the recording material constituting the recording layer, it is possible to similarly perform analog recording or multi-value digital recording.

In each above recording, analog or multi-value digital recording becomes possible by changing the voltage $V_W$ applied to the selected memory cell in accordance with the data to be recorded.

For example, when recording four levels in a material having the characteristic shown in FIG. 26, by assigning $V_W$=2.5V, 2.9V, 3.1V, and 3.6V in accordance with the data, recording of four levels, that is, 2 bit/cell recording, becomes possible. Here, it is important that the resistances of the unselected memory cells do not change even if a voltage of a half of the maximum application voltage $V_{Wmax}$ is applied.

If there is a large variation in the resistance after recording due to differences of the initial resistance values or recording conditions caused by the variations in shape among devices, there will be many levels and stable multi-value recording will not be possible.

In order to solve such a problem, use can be made of the method monitoring the voltage applied to a memory cell at the time of recording or the current flowing through the memory cell and recording data by feeding back the signal to a recording control circuit, that is, applying recording compensation.

Figure 29:
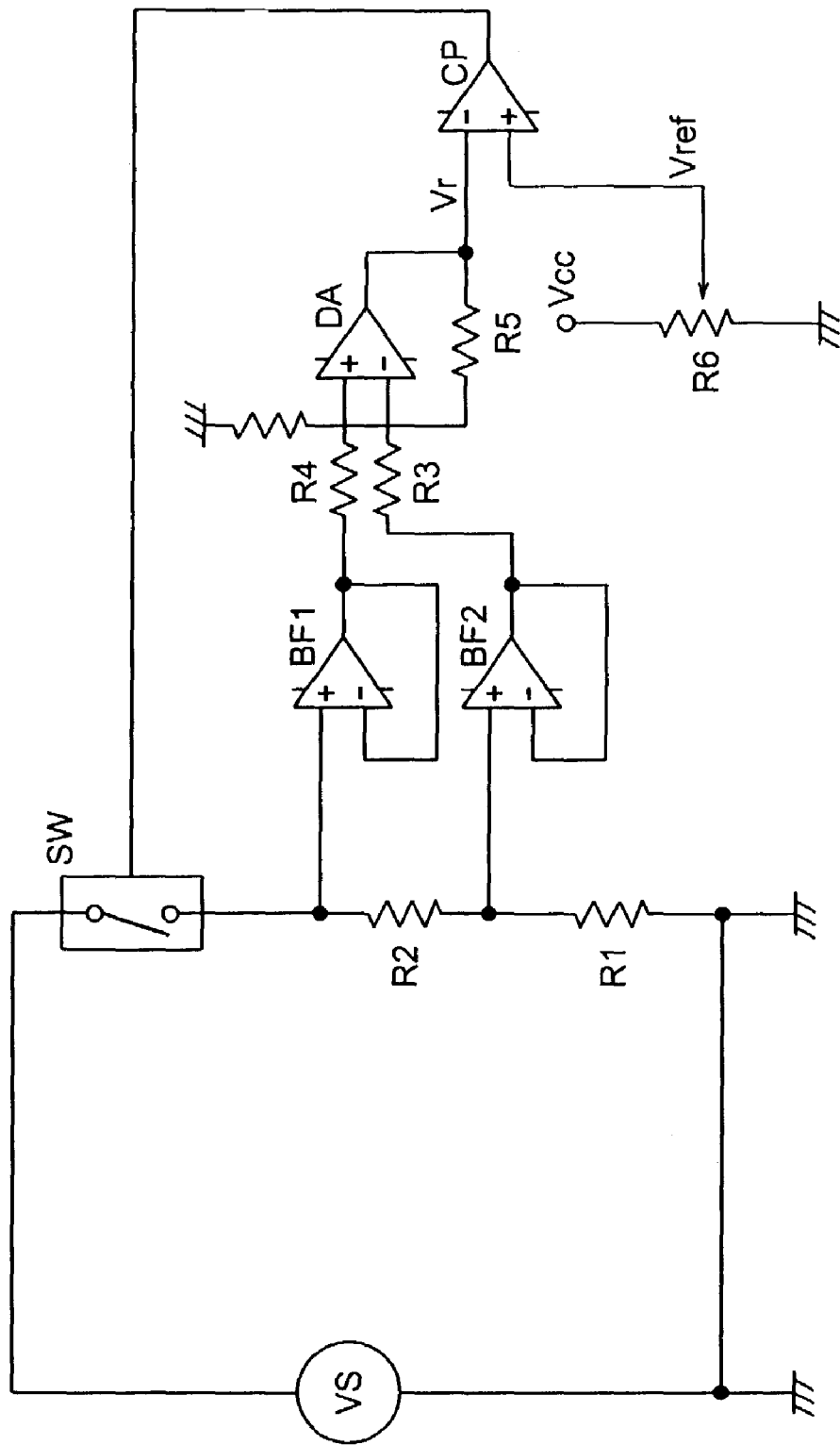
FIG. 29 is an example of the equivalent circuit diagram of a recording compensation circuit of a memory device according to the fourth embodiment.

An example of an equivalent circuit diagram of a recording compensation circuit is shown in FIG. 29.

A resistor layer R1 made of the recording layer of a memory cell has connected to it resistor elements R2 to R6, buffers BF1 and BF2, a differential amplifier DA, comparator CP, switch SW, power supply VS, and voltage line Vcc.

Here, the initial value of the resistor layer R1 of the memory cell is set to 100 kΩ. A signal detection resistor R2 having a smaller resistance value than R1 and a switch SW made of a MOS transistor are formed on a bit line connected to the memory cell. This is a circuit for controlling the time of application of the voltage pulse so as to set the resistance value of the memory cell to a desired value.

When the resistance of the memory cell is high, the current flowing through the bit line is small, therefore the voltage drop across the resistor R2 is small. Accordingly, a read signal voltage $V_r$ becomes lower than the reference voltage $V_{ref}$, the output of the comparator CP becomes "High", the switch SW becomes ON, and the current continuously flows.

As the data is recorded, the resistance R1 of the memory cell falls, the switch SW becomes OFF at a timing where $V_{ref}$ becomes equal to $V_r$, and the recording is terminated.

Note that in the above circuit, a reference signal is necessary for setting the resistance of the cell. For example, there is the method of using one cell among the memory cells connected to a common word line as the reference cell and using the resistance value thereof as the reference or the method of using the resistance value of a selected memory cell before recording as the reference.

Note that, the recording circuit of FIG. 29 can be used as it is also as a read circuit. The signal output in this case is $V_r$. Binary data can be identified or multi-value levels can be detected by a comparison with $V_{ref}$.

In reading as well, in the same way as the case of recording, it is necessary to control the voltage applied to the selected memory cell and unselected memory cells or the current flowing there.

Assume the case of reading signals of memory cells connected to the same word line.

For example, when reading data of a memory cell connected to the word line WL1, first the potential of the word line WL1 is set to the read voltage $V_R$ and the potential of the bit line corresponding to the memory cell to be read is set to the ground level (0V). It is also possible to set all bit lines to the ground level.

Further, the potentials of the unselected word lines (WL2, WL3, WL4) are set to the ground level.

Here, the value of $V_R$ is naturally set so that the resistance of the recording material does not change before and after the reading even if $V_R$ is applied to the memory cell. In short, $0<V_R<V_W$.

If the resistance value at the time of reading data from a selected memory cell is $R_R$, the current flowing through the bit line BLy is $V_R/R_R$. Since $R_R$ differs in accordance with the recorded data, in the final analysis, it becomes possible to read data by detecting the value of the current flowing through the bit line BLy. For example, when $V_R$=0.4V, $R_{R1}$=200 kΩ, and $R_{R2}$=160 kΩ, $I_{R1}$ becomes equal to 2 μA, and $I_{R2}$ becomes equal to 2.5 μA.

For example, when resistance for current-to-voltage conversion is connected to each bit line, and the resistance value thereof is for example 20 k{fourth root}, signals of 40 mV and 50 mV are generated in accordance with the signals described above. These signal output voltages are small in comparison with the output signal of a general DRAM etc., but in the present invention, signals of bit lines sharing a word line can be read together, therefore even if the signal detection time of one cell is made long, the data reproduction speed at the time of reading can be sufficiently raised. Further, since a current read circuit or amplifier can be disposed directly beneath each cell array, when the cell array is not so large, it is possible to provide a read circuit or amplifier near the cells, so noise due to parasitic capacitance between interconnects or the like becomes small and data can be sufficiently reproduced.

The same can be done for reproduction in the case of multi-value recording. However, since the signal amount becomes further smaller, the read speed per cell becomes slower in comparison with detection of the usual binary digital signal.

Usually, a PROM can only be recorded in once.

However, with a recording material capable of multi-value recording, recording circuit, and read circuit, it is possible to additionally write data in a memory cell already recorded in once.

For example, when four levels can be set, that is, when 2 bits of data can be set in each memory cell, for example, in the case of a recording material having a resistance becoming successively smaller along with recording, at the initial recording, binary data is digitally recorded by using the two upper significant levels of resistance. When additionally writing data, namely, in the second recording, the data is recorded by the second and third highest levels of resistance so as to enable digital recording of binary data. When further additionally writing data, that is, in the third recording, data is recorded by the two low levels of resistance. Accordingly, in a PROM capable of 4-level multi-value recording, when digitally recording binary data, a maximum of three recordings becomes possible.

Similarly, in a PROM capable of 8-level multi-value recording, when digitally recording binary data, a maximum of seven recordings becomes possible. With 16 levels, a maximum of 15 recordings becomes possible. That is, in a PROM capable of n-level multi-value recording, a maximum of (N−1) recordings becomes possible.

Further, for example, in the PROM capable of 16-level multi-value recording, by using 8 levels of these in the initial recording to record 3 bits of data per memory cell and using the remaining 8 levels for additional writing, it becomes possible to record 3 bits of data per memory cell two times without regard to the previous recorded data.

In this way, it is possible to set the multi-value recording levels and number of repeated recordings and becomes possible to broaden the range of application of a PROM.

The address information of the used recording blocks, arrays, or memory cells, the number of times of repeated recording, the multi-value levels used, and other recording management data are recorded and stored using a nonvolatile memory of the present invention and processed by a CPU or the like provided in the peripheral circuits.

Further, in a PROM, the recording and reading test in the inspection process cannot be applied to all cells. Therefore, it was difficult to guarantee a high reliability. In a PROM capable of multi-value recording, however, it is possible to perform the recording and reproduction test in the inspection process by using the two upper significant levels, so it becomes possible to guarantee a high reliability.

The block diagram of the circuit configuration of a memory device according to the present embodiment is similar to FIG. 12 showing a block diagram of the circuit configuration of a memory device according to the first embodiment.

The portions surrounded by the broken lines, that is, other than the memory portion 20, become the peripheral circuit portion formed on the silicon semiconductor substrate. The memory cell array, that is, the memory portion 20, is formed above this.

Though omitted in FIG. 12, it is assumed that a plurality of memory cell arrays are provided with respect to one memory device (memory chip). A plurality of memory cell arrays and peripheral circuits, that is, cell input/output circuits 22, read circuits 27, recording circuits 28, row decoders 21 and column decoders 23, address selection circuits 24, and block selection circuits (not shown) are provided with respect to one memory device (memory chip).

It is possible to provide a single array selection circuit 25 for selecting one of these plurality of memory cell arrays, input/output interface 31 for transferring data with the outside, buffer memory 30 for temporarily storing data input from the outside or output to the outside, error correction circuit 29 for correcting error after the recording or at reading, control circuit 26 for controlling the array selection (address selection), error correction, and transfer of data or clocks between the buffer memory and the input/output interface, and other memory common circuits in the memory device (memory chip), that is, have them shared by the memory cell arrays. Note that it is also possible to employ a configuration providing a plurality of these circuits in the memory device (memory chip) or conversely possible to employ a configuration providing one memory cell array and peripheral circuits in the memory device (memory chip).

Fifth Embodiment

The semiconductor memory device according to the fifth embodiment is substantially the same as the memory device according to the fourth embodiment, but differs in the structure of the memory cells.

Figure 30:
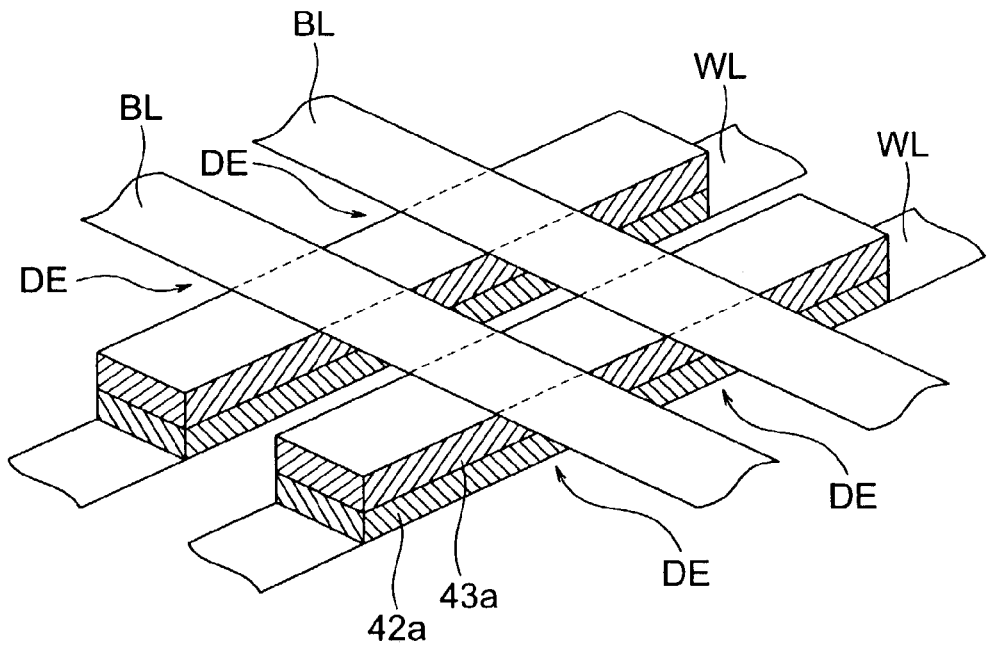
FIG. 30 is a schematic perspective view of memory cells in the memory portion of a memory device according to a fifth embodiment.

FIG. 30 is a schematic perspective view of the memory cells in the memory portion of a memory device according to the present embodiment. Four memory cells are shown in the figure.

In the semiconductor memory device according to the fourth embodiment shown in FIG. 15, the recording layer constituting the memory cells is patterned for every cell so that adjacent cells are completely isolated from each other, but it is not always necessary to isolate cells. For example, a cell may be connected to a cell adjacent in the extending direction of a word line WL as in the memory device according to the present embodiment shown in FIG. 30. In this case, the portions in regions where the bit lines BL and word lines WL extending so as to intersect with each other intersect become the 2-terminal devices DE constituting the memory cells.

Note that, an adjacent cell has effects at the time of recording or at the time of reproduction, but by optimization of the recording pulse current or by elimination of the crosstalk signal or other tricks in signal detection, these effects can be avoided.

The semiconductor memory device according to the present embodiment can be produced substantially in the same way as in the fourth embodiment.

Namely, after patterning the bit lines BL in the method of production of the memory device according to the fourth embodiment, the process is ended without etching the recording layer along the pattern of the bit lines BL.

Sixth Embodiment

Figure 31:
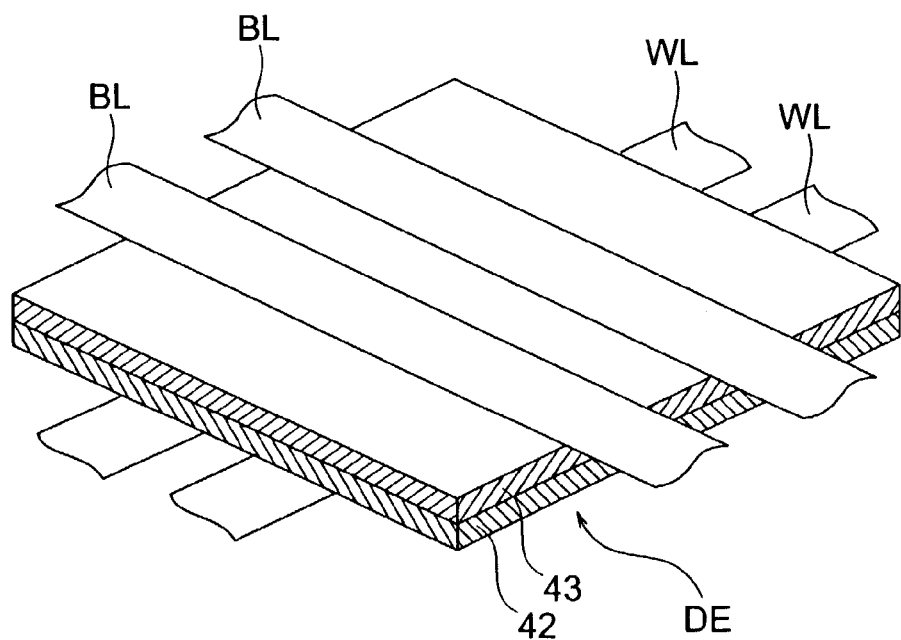
FIG. 31 is a schematic perspective view of memory cells in the memory portion of a memory device according to a sixth embodiment.

The memory device according to the sixth embodiment is substantially the same as the memory device according to the fourth embodiment. FIG. 31 is a schematic perspective view of memory cells in the memory portion of a memory device according to the present embodiment.

Namely, the recording layer constituting the memory cells is not separated at all among cells. The layers are uniformly formed. In this case as well, the portions in regions where the bit lines BL and word lines WL extending so as to intersect with each other intersect become 2-terminal devices DE constituting the memory cells.

The memory device according to the present embodiment can be produced substantially in the same way as the fourth embodiment.

Namely, after depositing the conductive layer forming the word lines in the method of production of the memory device according to the fourth embodiment, the layer is first patterned to form the word lines, then the recording layer is deposited. The bit lines BL are formed on it without them being patterned.

The present invention is not limited to the above embodiment. For example, in the present embodiment, the explanation was given of use of a method of production capable of microprocessing but having a low alignment precision for the memory portion of a memory device using a semiconductor or the like for the memory material, but the invention is not limited to this. The present invention may be applied to all semiconductor devices where the same pattern is repeated and micropatterns become necessary.

Summarizing the effects of the present invention, according to the memory device of the present invention, the peripheral circuit portion formed by the first minimum processing dimension and the memory portion formed by the second minimum processing dimension smaller than the first minimum processing dimension are stacked in the structure, and the memory portion is stacked with respect to the peripheral circuit portion with an alignment precision rougher than the second minimum processing dimension. Since the peripheral circuit portion and the memory portion are stacked as separate layers in this way, a microprocessing method having a very small processing size and not requiring high precision alignment can be employed for the memory portion requiring miniaturization for enlarging the capacity.

According to the method of production of the memory device of the present invention, the memory device of the present invention can be produced. According to the method of use of the memory device of the present invention, the state of connection of the contacts is judged and addresses assigned to the memory cells constituting the memory portion for use of the memory device in the inspection process before shipping the memory device or at the time of usage of the memory device by the user.

According to the semiconductor device of the present invention, the first semiconductor portion formed by the first minimum processing dimension and the second semiconductor portion formed by the second minimum processing dimension smaller than the first minimum processing dimension are stacked on each other and the second semiconductor portion is stacked with respect to the first semiconductor portion by an alignment precision rougher than the second minimum processing dimension. Since the first semiconductor portion and the second semiconductor portion are stacked as separate layers in this way, a microprocessing method not requiring high precision alignment and having a very small processing size can be employed for the second semiconductor portion.

Also, by the method of production of the semiconductor device of the present invention, the semiconductor device of the present invention described above can be produced.

Also, according to the memory device of the present invention, the memory portion has a plurality of first interconnects extending in the first direction and a plurality of second interconnects extending in a direction different from the first direction, regions where the first interconnects and the second interconnects intersect correspond to individual memory cells, contact portions connecting the first interconnects and peripheral circuit portion are arranged in at least two columns in the direction in which the first interconnects extend, and contact portions connecting the second interconnects and peripheral circuit portion are arranged in at least two columns in the direction in which the second interconnects extend, whereby the memory device can be produced without requiring high precision alignment for forming a memory portion miniaturized for enlarging the capacity.

Also, according to the method of production of the memory device of the present invention, the memory device of the present invention described above can be produced.

While the invention has been described with reference to specific embodiments chosen for purpose of illustration, it should be apparent that numerous modifications could be made thereto by those skilled in the art without departing from the basic concept and scope of the invention.

What is claimed is:

1. A memory device having:
a peripheral circuit portion formed by a first minimum processing dimension, a memory portion stacked above said peripheral circuit portion and having a plurality of memory cells formed by a second minimum processing dimension smaller than said first minimum processing dimension, and
contact portions connecting said peripheral circuit portion and said memory portion, wherein
said memory portion is stacked with respect to said peripheral circuit portion by an alignment precision rougher than said second minimum processing dimension;
wherein said peripheral circuit portion includes a circuit for judging a state of connection of said memory portion and the interconnects.

2. A memory device having:
a peripheral circuit portion formed by a first minimum processing dimension, a memory portion stacked above said peripheral circuit portion and having a plurality of memory cells formed by a second minimum processing dimension smaller than said first minimum processing dimension, and
contact portions connecting said peripheral circuit portion and said memory portion, wherein
said memory portion is stacked with respect to said peripheral circuit portion by an alignment precision rougher than said second minimum processing dimension; and
wherein said memory portion has a plurality of first interconnects extending in a first direction and has a plurality of second interconnects extending in a direction different from said first direction, regions where said first interconnects and said second interconnects intersect corresponding to individual memory cells; and
wherein, in said contact portions, a plurality of first contacts connected to said peripheral circuit portion and a plurality of second contacts connected to said memory portion are connected,
the number of said first contacts is larger than the number of said second contacts,
each second contact is connected to at least one first contact,
each first contact is connected to at most one second contact, and
one second contact is connected to any one interconnect among the plurality of said first interconnects and the plurality of said second interconnects.

3. A memory device as set forth in claim 2, wherein:
said plurality of first contacts have rectangular shapes and are arranged in matrix having a one-dimensional or two-dimensional direction of arrangement;
said plurality of second contacts have rectangular shapes and are arranged cyclically repeated in the same direction of arrangement as the direction of arrangement of said first contacts; and
a length L1 of the first contacts and space S1 between said first contacts and a length L2 of the second contacts and space S2 between said second contacts are in the relationships of the following inequalities (1) and (2) for the direction of arrangements of the first contacts and the second contacts:

$$L1 < S2 \tag{1}$$

$$S1 < L2 \tag{2}$$

4. A memory device as set forth in claim 2, wherein
said plurality of second contacts have linear shapes and are arranged cyclically repeated in the direction of arrangement of the second contacts;
said plurality of first contacts have rectangular shapes and are arranged cyclically repeated in a direction of arrangement perpendicular to the direction of arrangement of said second contacts while shifted by increments of predetermined distances in the direction of arrangement of said second contacts;
a space S3, with respect to the direction of arrangement of the second contacts, between two first contacts formed adjacent to each other in said direction of arrangement perpendicular to the direction of arrangement of the second contacts and length L3 of said first contacts with respect to the direction of arrangement of the second contacts and a length L4 of said second contacts and a space S4 between said second contacts are in the relationships of the following inequalities (3) and (4):

$$L3 < S4 \tag{3}$$

$$S3 < L4 \tag{4}$$

5. A memory device as set forth in claim 4, wherein said second contacts are formed from extensions of said plurality of first interconnects and said plurality of second interconnects.

* * * * *